US011532922B2

(12) United States Patent
Forman et al.

(10) Patent No.: US 11,532,922 B2
(45) Date of Patent: Dec. 20, 2022

(54) III-NITRIDE SURFACE-EMITTING LASER AND METHOD OF FABRICATION

(71) Applicant: The Regents of the University of California, Oakland, CA (US)

(72) Inventors: Charles Forman, Fremont, CA (US); SeungGeun Lee, Gyeonggi-Do (KR); Erin C. Young, Mountain View, CA (US); Jared Kearns, Goleta, CA (US); Steven P. DenBaars, Goleta, CA (US); James S. Speck, Santa Barbara, CA (US); Shuji Nakamura, Santa Barbara, CA (US)

(73) Assignee: THE REGENTS OF THE UNIVERSITY OF CALIFORNIA, Oakland, CA (US)

(*) Notice: Subject to any disclaimer, the term of this patent is extended or adjusted under 35 U.S.C. 154(b) by 161 days.

(21) Appl. No.: 16/652,282

(22) PCT Filed: Oct. 2, 2018

(86) PCT No.: PCT/US2018/053982
§ 371 (c)(1),
(2) Date: Mar. 30, 2020

(87) PCT Pub. No.: WO2019/070719
PCT Pub. Date: Apr. 11, 2019

(65) Prior Publication Data
US 2020/0244036 A1   Jul. 30, 2020

Related U.S. Application Data

(60) Provisional application No. 62/566,843, filed on Oct. 2, 2017.

(51) Int. Cl.
*H01S 5/00* (2006.01)
*H01S 5/183* (2006.01)
(Continued)

(52) U.S. Cl.
CPC ............ *H01S 5/183* (2013.01); *H01S 5/0213* (2013.01); *H01S 5/0234* (2021.01);
(Continued)

(58) Field of Classification Search
CPC ...... H01S 5/183; H01S 5/0234; H01S 5/0237; H01S 5/0213; H01S 5/02469;
(Continued)

(56) References Cited

U.S. PATENT DOCUMENTS 6,285,702 B1 * 9/2001 Caprara .................. H01S 5/141
372/92
8,000,371 B2 * 8/2011 Strittmatter ............ B82Y 20/00
372/71
(Continued)

FOREIGN PATENT DOCUMENTS

CN   101295753 B    4/2011
JP   2015035542 A   2/2015
WO  2018035322 A1   2/2018

OTHER PUBLICATIONS

Japanese Notice of Reasons for Rejection dated Jun. 21, 2021 for Japanese Application No. 2020-518691.
(Continued)

*Primary Examiner* — Kinam Park
(74) *Attorney, Agent, or Firm* — Gates & Cooper LLP

(57) ABSTRACT

A Vertical Cavity Surface Emitting Laser (VCSEL) including a light emitting III-nitride active region including quantum wells (QWs), wherein each of the quantum wells have a thickness of more than 8 nm, a cavity length of at least 7 λ, or at least 20 λ, where lambda is a peak wavelength of the light emitted from the active region, layers with reduced surface roughness, a tunnel junction intracavity contact. The
(Continued)

VCSEL is flip chip bonded using In—Au bonding. This is the first report of a VCSEL capable of continuous wave operation.

21 Claims, 21 Drawing Sheets

(51) Int. Cl.
| | |
|---|---|
| H01S 5/02 | (2006.01) |
| H01S 5/024 | (2006.01) |
| H01S 5/30 | (2006.01) |
| H01S 5/343 | (2006.01) |
| H01S 5/0234 | (2021.01) |
| H01S 5/0237 | (2021.01) |
| H01S 5/02355 | (2021.01) |
| H01S 5/32 | (2006.01) |
| H01S 5/10 | (2021.01) |

(52) U.S. Cl.
CPC ........ *H01S 5/0237* (2021.01); *H01S 5/02355* (2021.01); *H01S 5/02469* (2013.01); *H01S 5/18369* (2013.01); *H01S 5/3095* (2013.01); *H01S 5/34333* (2013.01); *H01S 5/1039* (2013.01); *H01S 5/18308* (2013.01); *H01S 5/32025* (2019.08); *H01S 5/320275* (2019.08); *H01S 2304/02* (2013.01)

(58) Field of Classification Search
CPC ............... H01S 5/18369; H01S 5/3095; H01S 5/34333; H01S 5/320275; H01S 5/32025; H01S 5/02355; H01S 5/1039; H01S 5/18308; H01S 2304/02
See application file for complete search history.

(56) References Cited

U.S. PATENT DOCUMENTS

| | | | | |
|---|---|---|---|---|
| 9,166,375 | B2* | 10/2015 | Strittmatter | B82Y 20/00 |
| 9,773,704 | B2* | 9/2017 | Holder | H01L 21/02458 |
| 2002/0105997 | A1 | 8/2002 | Zhang | |
| 2007/0051939 | A1 | 3/2007 | Nakahara et al. | |
| 2009/0120997 | A1 | 5/2009 | Oudar et al. | |
| 2012/0163138 | A1* | 6/2012 | Gage | G11B 5/6088 |
| | | | | 29/603.07 |
| 2014/0072009 | A1* | 3/2014 | Wunderer | H01S 5/327 |
| | | | | 372/45.012 |
| 2015/0043601 | A1 | 2/2015 | Hamaguchi et al. | |
| 2018/0241173 | A1* | 8/2018 | Taylor | H01S 5/3004 |

OTHER PUBLICATIONS

Leonard, J.T., et al., Nonpolar III-nitride vertical-cavity surface-emitting lasers incorporating an Ion implanted aperture, Applied Physics Letters, US, AIP Publishing, Jul. 6, 2015, vol. 107, 011102 (5 pages).

Leonard, J.T., et al., Smooth e-beam-deposited tin-doped indium oxide for III-nitride vertical-cavity surface-emitting laser intracavity contacts, Applied Physics Letters, US, AIP Publishing, Oct. 13, 2015, vol. 118, 145304 (13 pages).

Mishkat-UI-Masabih, Saadat, et al., Techniques to reduce thermal resistance in flip-chip GaN-based VCSELs, Physical Status Solidi A, US, Wiley, Jun. 22, 2017, vol. 214, No. 8, 1600819 (5 pages).

PCT International Search Report dated Feb. 12, 2019 for PCT Application No. PCT/US2018/053982.

Forman et al., "Continuous-wave operation of nonpolar GaN-based vertical-cavity surface-emitting lasers," Proc. SPIE 10532, Gallium Nitride Materials and Devices XIII, 105321C-1 to 105321C-11 (Feb. 23, 2018). Discussing one or more of the references cited in Applicant's specification, including Onishi [2], Hsieh [11], Higushi [8], Liu [16].

Holder et al., "Demonstration of Nonpolar GaN-Based Vertical-Cavity Surface-Emitting Lasers". Appl. Phys. Express 5 (2012) pp. 092104-1 to 092104-3.

Onishi et al., "Continuous Wave Operation of GaN Vertical Cavity Surface Emitting Lasers at Room Temperature". IEEE Journal of Quantum Electronics, vol. 48, No. 9, Sep. 2012, pp. 1107-1112.

Wiemer et al., "Solid-Liquid Interdiffusion Bonding (SLID) at Wafer Level". Fraunhafer Institute for Electronic Nano Systems ENAS, two pages.

Forman, "Achieving Continuous-Wave Lasing for Violet m-plane GaN-Based Vertical-Cavity Surface-Emitting Lasers". UC Santa Barbara Electronic Theses and Dissertations, 2018, 63 pages.

Japanese Notice of Reasons for Rejection dated May 2, 2022 for Japanese Application No. 2020-518691.

Yuka Ito et al., Vertical-cavity surface-emitting laser chip bonding by surface-tension-driven self assembly for optoelectronic heterogeneous integration, Japanese Journal of Applied Physics, JP, Jan. 16, 2015, vol. 54, 030206 (6 Pages).

\* cited by examiner

III-NITRIDE SURFACE-EMITTING LASER AND METHOD OF FABRICATION

CROSS REFERENCE TO RELATED APPLICATIONS

This application claims the benefit under 35 U.S.C. Section 119(e) of the following commonly-assigned U.S. Provisional Patent Application No. 62/566,843, filed Oct. 2, 2017, by Charles Forman, SeungGeun Lee, Erin Young, Jared Kearns, Steven P. DenBaars, James S. Speck, and Shuji Nakamura, entitled "III-NITRIDE SURFACE-EMITTING LASER AND METHOD OF FABRICATION,"

which application is incorporated by reference herein.

BACKGROUND OF THE INVENTION

1. Field of the Invention

The present invention relates to A Vertical Cavity Surface Emitting Laser (VCSEL) and a method of making the same.

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

Vertical-cavity surface-emitting lasers (VCSELs) are semiconductor laser diodes that emit light normal to the substrate. This design has many advantages over edge-emitting lasers and light-emitting diodes, such as low threshold current, circular mode profile, high-speed direct modulation, ability for single longitudinal mode operation, and two-dimensional arraying capability [1]. As opposed to arsenide and phosphide-based devices, electrically-injected III-nitride VCSELs have been relatively difficult to create, and only eight research groups have successfully demonstrated these devices in the past decade [2]-[26]. While most of the reports have been on c-plane, m-plane VCSELs have been demonstrated [4], [10], [12], [15], [24] and have many advantages, such as lack of the quantum confined. Stark effect, higher material gain, and anisotropic gain that leads to 100% polarization ratio. III-nitride-based devices emit at wavelengths in the ultraviolet and visible spectrum which leads to novel applications in solid-state lighting, visible light communication, displays, projectors, and sensors. However, m-plane VCSEL devices have not been able to achieve continuous wave operation. The present invention satisfies this need.

SUMMARY OF THE INVENTION

To overcome the limitations in the prior art described above, and to overcome other limitations that will become apparent upon reading and understanding this specification, embodiments of the present invention disclose a VCSEL bonded to a flip chip substrate using Au—In solid-liquid interdiffusion (SLID) bonding. The SLID bonding solved a cracking problem discovered previous VCSEL devices formed using Au—Au thermocompression bonding and greatly improved VCSEL yield (as the SLID was conducted at lower temperatures and bonding forces). Furthermore, the SLID bonding enabled a much thicker metal pathway for heat transport so that continuous wave operation of the VCSEL could be achieved.

In further embodiments, the III-Nitride VCSEL included an active region that has thick quantum wells (QWs) (e.g., thickness>8 nm or >9nm). Thicker QWs are possible on semipolar or nonpolar m-plane GaN, in contrast with standard c-plane GaN.

An embodiment of the invention was demonstrated and achieved continuous-wave (CW) operation at room temperature. The embodiment is a dual-dielectric DBR m-plane VCSEL with MBE-grown tunnel junction contact and ion implanted aperture (similar to reference [5]), having an active region comprising a 2 period multi quantum well (MQW) with 14 nm QWs and a 1 nm barrier. Improved thermal performance and yield for this device structure was achieved using indium-gold flip-chip bonding (instead of gold-gold bonding). The embodiment has a longer cavity length (23 $\lambda$ instead of 7 $\lambda$, where $\lambda$ is the wavelength of light emitted by the VCSEL) and was fabricated using improved Molecular Beam Epitaxy (MBE) regrowth conditions and by removing an oxide residue after photoelectrochemical (PEC) etching.

However, the VCSEL can be embodied in many ways, including but not limited to, the following examples.

1. A VCSEL on a mount (e.g., flip chip substrate), and a thermally conductive bond between the mount and the VCSEL, the bond comprising a layer of metal having a thermal conductivity such that heat, generated during operation of the VCSEL, is transferred from the VCSEL to the mount and the VCSEL emits continuous wave electromagnetic radiation.

2. The device of example 1, wherein the thermally conductive bond comprises no cracks or fewer cracks than a bond between the VCSEL and the mount formed using Au—Au thermal compression bonding.

3. The device of one or any combination of the previous examples, wherein the thermally conductive bond comprises metal formed from a liquid metal phase.

4. The device of one or any combination of the previous examples, wherein the VCSEL is bonded to the mount by solid-liquid interdiffusion bonding (e.g., realized by short liquid phase of one low melting metal and immediate solidification caused by diffusion and intermixing with a second high melting point metal, generating the intermetallic phase)

5. The device of one or any combination of the previous examples, wherein the VCSEL comprises a first mirror and a second mirror defining a cavity for the electromagnetic radiation, and the VCSEL is bonded to the mount by forming the bond. comprising a metal layer, in a liquid state, around the first mirror.

6. The device of one or any combination of the previous examples, wherein: the VCSEL comprises a first mirror and a second mirror defining a cavity for the electromagnetic radiation, the bond comprises a metal layer, and one of the first mirror or the second mirror is embedded in the metal layer.

7 The device of one or any combination of the previous examples, wherein the VCSEL, comprises a first mirror and a second mirror defining a cavity for the electromagnetic radiation, and the bond comprises a metal layer cast around the first mirror or the second mirror acting as a mold for the metal layer.

8. The device of one or any combination of the previous examples, wherein the bond comprises an intermetallic compound having a solid phase containing two or more metallic elements.

9. The device of one or any combination of the previous examples, wherein the bond comprises a first metal diffused into a second metal so as to intermix with a second metal, the first metal having a lower melting point than the second metal.

10. The device of one or any combination of the previous examples, wherein first metal comprises indium and the second metal comprises gold.

11. The VCSEL of one or any combination of the previous examples, comprising a light emitting III-nitride active region including quantum wells (QWs), wherein each of the quantum wells have a thickness of more than 8 nm.

12. The VCSEL of example 11, wherein the thickness of the quantum wells is in a range of 8-20 nm.

13. The VCSEL of one or any combination of the previous examples, wherein active region has a nonpolar or semipolar crystal orientation.

14. The VCSEL of one or any combination of the previous examples, wherein the VCSEL has a cavity length of at least 7 λ, where λ is a peak wavelength of light emitted from the active region when the light is in the active region and the peak wavelength is the wavelength of the light having the highest intensity 15. The VCSEL of example 4, wherein the cavity length is in a range of 20 λ-100 λ.

16. The VCSEL of one or any combination of the examples 1-5, wherein the VCSEL further includes the active region between a first III-nitride n-type layer and a III-nitride p-type layer, a second III-nitride n-type layer forming a tunnel junction with the III-nitride p-type layer, a contact layer for the tunnel junction, and a top surface of the contact layer having a root mean square surface roughness (RMS) of less than 2 nanometers (nm) when the VCSEL is a nonpolar device or less than 1 nm when the VCSEL is a semipolar device.

17. The VCSEL of one or any combination of the previous examples, wherein the active region is between a III-nitride n-type layer and a III-nitride p-type layer, an n-side surface of the III-nitride layer is exposed after etching to at least partially remove the substrate on which the active region was grown, and the n-side surface is surface treated and has an RMS surface roughness less than 1 nm.

18. The VCSEL of examples 16 or 17, wherein the surface roughness is over a 5 μm×5 μm, a 1 μm×1 μm, or 10 μm×10 μm area.

19. The VCSEL, of example 16-17, wherein the surface treatment removes an oxide residue after the etching.

20. The VCSEL, of one or any of the examples 1-19, further comprising: a mirror; a metal layer on the mirror; a flip chip substrate; a bonding layer including gold on the flip chip substrate; a bonded interface between the bonding layer and the metal layer, wherein the bonded interface includes indium bonded to the gold.

21. The device of any of the preceding examples, further comprising a first charge injection layers coupled to a light emitting active region, wherein the active region emits the light in response to electrons and holes injected into the active region through charge injection layers.

22. A VCSEL comprising a light emitting III-nitride active region including quantum wells (QWs), wherein each of the quantum wells have a thickness of more than 8 nm.

23. The VCSEL of example 22, in combination with one or any combination of examples 1-10 or 11-21.

24. A method of fabricating a Vertical Cavity Surface Emitting Laser (VCSEL) structure, comprising growing a sacrificial layer on a semipolar or nonpolar III-nitride substrate; growing a III-nitride VCSEL, structure including an active region between an n-type layer and a p-type layer, wherein the active region includes a quantum well having a thickness greater than 8 nm; at a temperature of less than 750° C., growing a tunnel junction structure on the p-type III-Nitride using an indium surfactant; depositing a mirror on a p-type side of the VCSEL structure; covering sidewalls of the active region with a dielectric layer; depositing metal on the mirror; flip chip bonding a flip chip substrate to the metal on the mirror using solid-liquid interdiffusion bonding, and photoelectrochemically etching the sacrificial layer so as to at least partially remove the nonpolar or semipolar III-nitride substrate; and removing, using a surface treatment, a rough residue on an n-type side of the VCSEL structure or on the surface of the n-type layer exposed during the etching.

25. The method of example 24, wherein the removing comprises treating the surface with Tergitol detergent or KOH.

26. The method of examples 24 or 25, wherein: the VCSEL structure is grown with a cavity length of at least 7 λ, where λ is a peak wavelength of light emitted from the active region when the light is in the active region; and the peak wavelength is the wavelength of the light having the highest intensity.

27. The method of examples 24, 25, or 26 wherein a surface of the n-type layer has a root mean square (RMS) surface roughness of less than 1 nm after the surface treatment.

28. The method of example 27, wherein the surface roughness is over a 5 μm×5 μm, a 1 μm×1 μm, or 10 μm×10 μm area.

30. The method of any of the examples 24-28, wherein the VSCEL emits continuous wave electromagnetic radiation.

31. A VCSEL emitting continuous wave electromagnetic radiation.

32. The VCSEL, of example 31, wherein the VCSEL comprises III-nitride,

33. A Vertical Cavity Surface Emitting Laser (VCSEL), comprising:
a light emitting III-nitride active region including quantum wells (QWs), wherein each of the quantum wells have a thickness of more than 8 nm.

BRIEF DESCRIPTION OF THE DRAWINGS

Referring now to the drawings in which like reference numbers represent corresponding parts throughout:

FIG. 11A and FIG. 11B. Thermal modelling shows that cracks in that metal contact in the VCSEL bonded to substrate severely impairs the thermal performance, wherein FIG. 11A shows the cracked Au pathway and FIG. 11B shows the uncracked Au pathway.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Technical Description

Figure 1A:
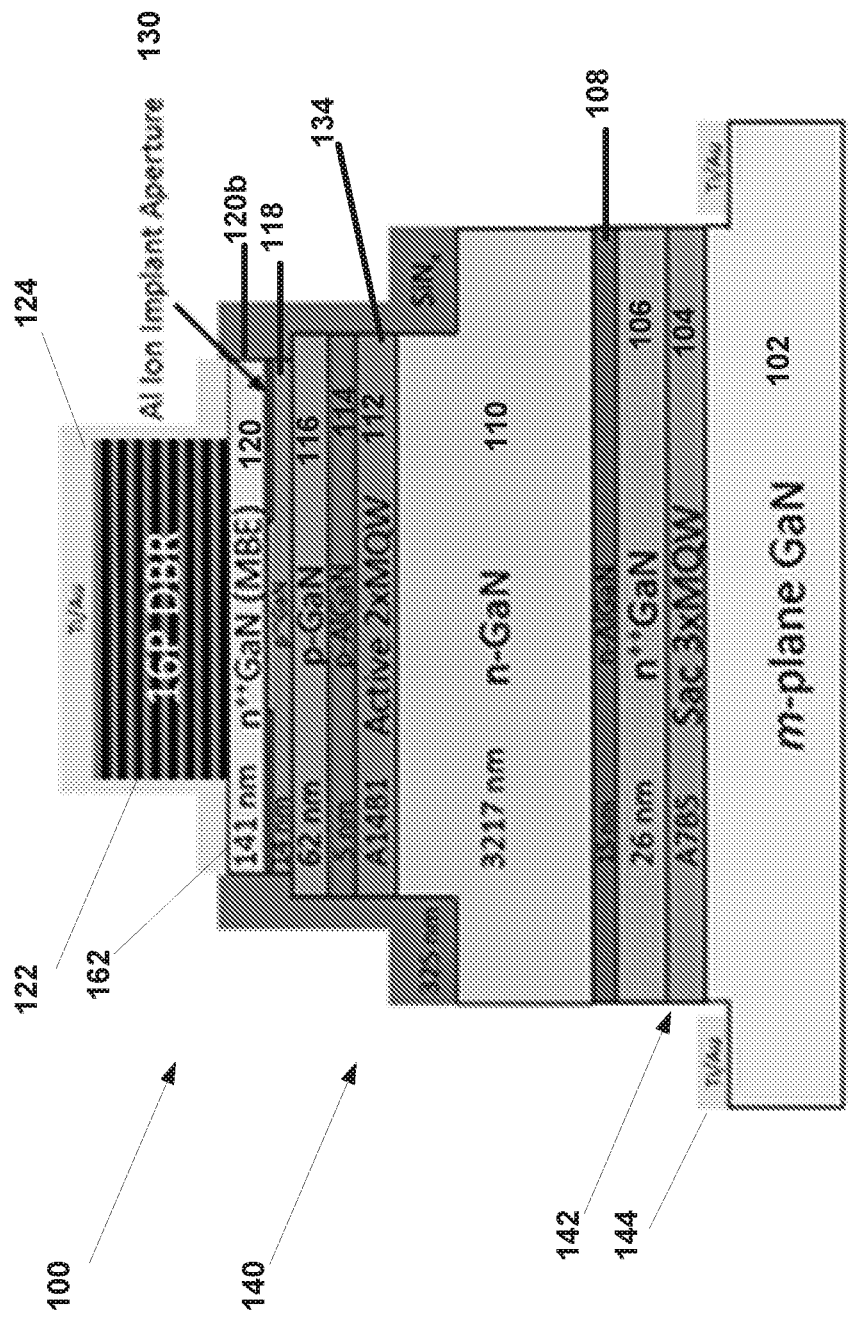
FIG. 1A. Schematic of the III-nitride VCSEL structure before the flip-chip bonding.
Figure 1B:
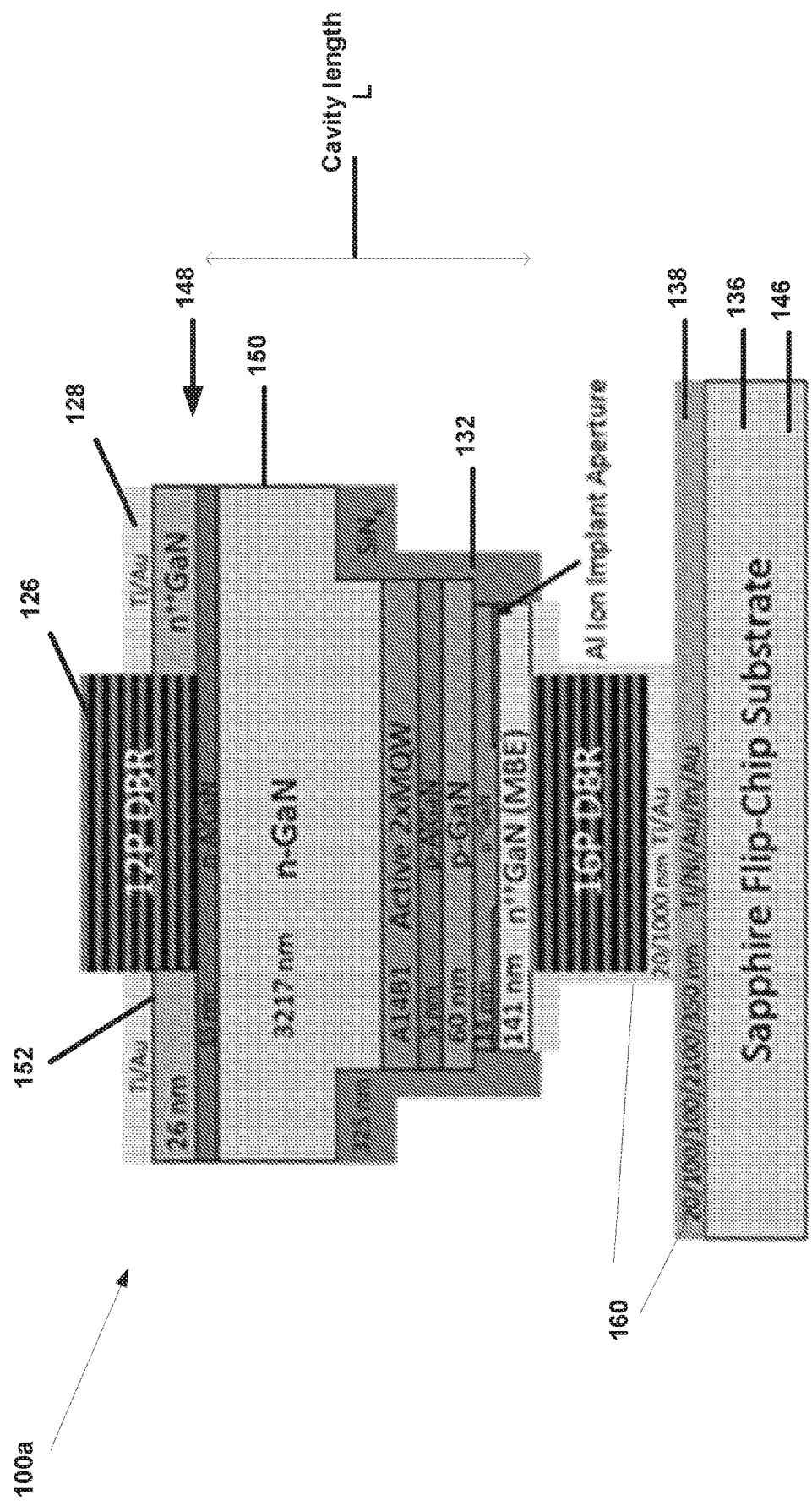
FIG. 1B. The complete structure after processing.

The present disclosure describes a III-nitride VCSEL with a tunnel junction intracavity contact and ion implanted aperture, as shown in FIGS. 1(a)-1(b).

FIG. 1A illustrates the VCSEL structure 100 prior to flip chip bonding comprises a substrate 102, a sacrificial layer 104 on or above the substrate 102, an n-type layer 106 on or above the sacrificial layer 104, an etch stop layer 108 on or above the n-type layer 106, an n-type layer 110 on or above the etch stop layer 108, an active layer 112 on or above the n-type layer 110, an electron blocking layer 114 on or above the active layer 112, a p-type layer 116 on or above the electron blocking layer 114, a p$^{++}$-type layer 118 (having a higher p-type dopant concentration than the p-type layer 116) on or above the p-type layer 116, an n-type layer 120 on or above the p$^{++}$-type layer 118, a mirror 122 on or above the n-type layer 120, and a metal layer 124 on or above the n-type layer 120.

FIG. 1B illustrates the VCSEL 100b after processing, comprising a second mirror 126 on or above the etch stop layer 108, the etch stop layer 108 on or above the n-type layer 106, a second metal layer 128 on or above the n-type layer 106, the n-type layer 110 on or above the etch stop layer 112, the active layer 114 on or above the n-type layer 110, the electron blocking layer 114 on or above the active layer 112, the p-type layer 118 on or above the electron blocking layer 114, the p$^{++}$-type layer 118 (having a higher p-type dopant concentration than the p-type layer 120) on or above the p-type layer 116, the n-type layer 120 on or above the p$^{++}$-type layer 118, the first mirror 122 on or above the n-type layer 120, and the first metal layer 124 on or above the n-type layer 120.

Both the structure 100 and VCSEL 100b also include a current aperture 130 and dielectric layer 132 on the sidewall 134.

The following sections describe key design changes and main performance improvements enabled by the present invention, as compared to the m-plane VCSEL reported in [10]. As a result, the present disclosure is the first report of an m-plane VCSEL that lases under continuous-wave (CW) operation at room temperature.

A. Improved Active Region Design with Thicker Quantum Wells

The present invention discloses the use of thicker quantum wells (e.g., 2×MQW: 14 nm QWs and 1 nm barriers) as compared to the 7×MQW with 3 nm QWs and 1 nm barriers) described in [10]. A key improvement resulting from the use of thicker QWs includes a higher gain enhancement factor: thicker QWs have more active gain medium aligned with the optical field, meaning that the modal gain is increased with the thicker QWs. Well thickness examples used herein are the widest QW thickness reported for III-nitride VCSELs because most reports are on c-plane which restricts the thickness because of the quantum confined Stark Effect (QCSE). m-plane oriented QWs allow for much thicker QWs due to the lack of QCSE.

B. Improved Flip-Chip Bonding Using Indium-Gold (In—Au) Bonding Instead of Au—Au Bonding In one or more embodiments, flip chip bonding using (In—Au) is used instead of Au—Au bonding as described in [10]. Prior m-plane VCSELs were not able to achieve CW operation due to poor thermal performance. The main pathway for heat transport is through the thin metal contact that goes around the bottom dielectric Distributed Bragg Reflector (DBR) to the flip-chip substrate. Cross-section SEM analysis of the Au—Au bonded device reveals that there are cracks and voids in the main metal pathway for heat transport, which likely prevents CW operation. Cracks and voids were caused by the high temperature and pressure required for Au—Au bonding.

Key improvements resulting from using In—Au bonding:
  In—Au bonding can be conducted at significantly lower force and temperature compared to Au—Au bonding.
  In—Au bonded devices have fewer cracks, and there is a much more robust pathway for heat transport in the In—Au bonded devices.

As a result, the use of In—Au bonding improves the thermal performance to enable CW VCSEL operation, C. Longer Cavity Length In one or more examples, the VCSEL has a cavity longer than 7 λ (e.g., 23 λ instead of 7 λ).

Heat generated in the active region cannot flow directly down to the flip-chip substrate due to the thermally-insulating bottom dielectric DBR. The main pathway for heat flow is through the thin metal contact on the p-side that goes around the bottom DBR.

COMSOL thermal modeling shows that increasing the cavity length greatly improves the thermal performance. GaN has a thermal conductivity of 130 W/mK, so increasing the cavity length aids heat distribution throughout the cavity and results in lower active region temperatures. Thicker cavity lengths also have a smaller resonant mode spacing, which ensures the alignment of a resonant mode with the gain spectrum. This is particularly helpful during CW operation as the gain spectrum redshifts considerably.

D. Improved MBE/MOCVD Tunnel Junction Regrowth.

In one or more embodiments, the VCSEL includes an MBE tunnel junction regrowth with indium surfactant at a lower growth temperature (e.g., growth at less than 750° C.). In one or more examples, the tunnel junction regrowth temperature is at 740° C. Reference [10] describes 750° C. growth without indium surfactant.

Key improvements resulting from the growth with indium surfactant:
  Molecular Beam Epitaxy (MBE) regrowth optimization experiments show that slightly lower growth temperatures improved the electrical characteristics and the addition of an indium surfactant improved the surface morphology.
  The root mean square (RMS) roughness of the MBE tunnel junction regrowth was 1.5 to 2 nm for the demonstrated CW VCSEL This design resulted in a lower series resistance and lower turn-on voltage, which is conducive for CW operation Maintaining a smooth surface morphology is crucial for VCSELs to minimize scattering loss. In addition to scattering loss, roughness reduces the reflectance of the DBRs because the roughness propagates throughout the DBRs. Ideally, the RMS roughness should be less than 1 nm or at least less than 6 nm (devices having a 6 nm RMS roughness did not reach the threshold for lasing), e.g., over a 5 μm×5 μm, a 1 μm×1 μm, or 10 μm×10 μm area.

MBE regrowth is relatively rough on m-plane, but it is much smoother on semipolar orientations. Therefore, semipolar orientated VCSELs could be fabricated. Another way to get a smooth surface on m-plane is metal organic chemical vapor deposition (MOCVD) tunnel junction regrowth.

E. Removal of Oxide Residue After PEC Undercut Etching

A rough oxide residue was discovered on the GaN surface after PEC undercut etching to remove the native m-plane GaN substrate. Conventional designs [10] did no treatment to remove residual oxide.

The presence of a rough oxide layer could explain some of the problems of previous designs [10].
  Previous devices [10] had a higher voltage, which could be attributed to the n-electrode contacting the oxide residue.
  Previous devices [10] exhibited filamentary lasing, which could be explained by the presence of a nonuniform oxide residue in the aperture.

The CW VCSEL described herein has less than 1 nm root mean square (RMS) roughness on the n-side after removing the PEC oxide residue. The most effective method to remove the residue was to submerge the sample in Tergitol detergent and gently swipe the sample with a foam swab. This method was performed on the VCSEL described herein.

Other methods of residue removal include submerging the sample in (or treating the sample with) aqueous KOH (i.e. 45% KOH for 30 min). Lower molarity KOH can be used if it is heated. This removes most of the residue, which indicates that the residue is likely a form of gallium oxide remaining after PEC etching. Although most of the residue could be removed with KOH, there were remaining cube-like features that could not be removed using KOH. These features are likely indium oxide or indium hydroxide and could be removed by swabbing in Tergitol. Other methods of residue removal include treating the sample in HCl Key improvements observed after removing the oxide residue include:
  Smooth surfaces on the n-side with less than 1 nm RMS roughness (e.g., over a 5 μm×5 μm, a 1 μm×1 μm, or 10 μm×10 μm area).
  Improved (reduced) turn-on voltage and series resistance.
  Elimination of filamentary lasing and the observation of a well-defined lateral optical mode.

F. Steps to Fabricate the Device a. Example Method

Figure 2:
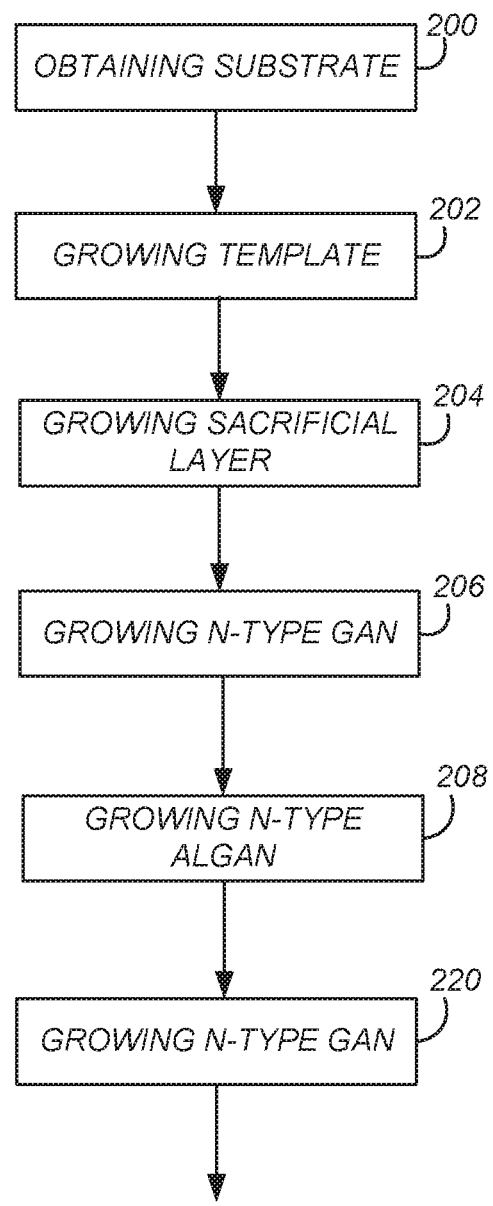
FIG. 2. Process flow for fabricating device of FIG. 1B.
Figure 2:
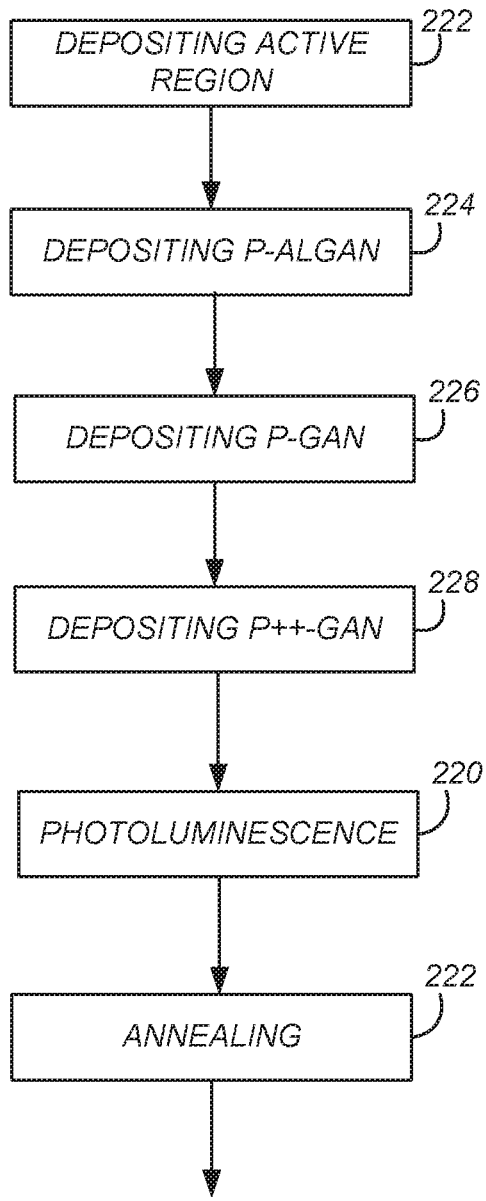
Figure 2:
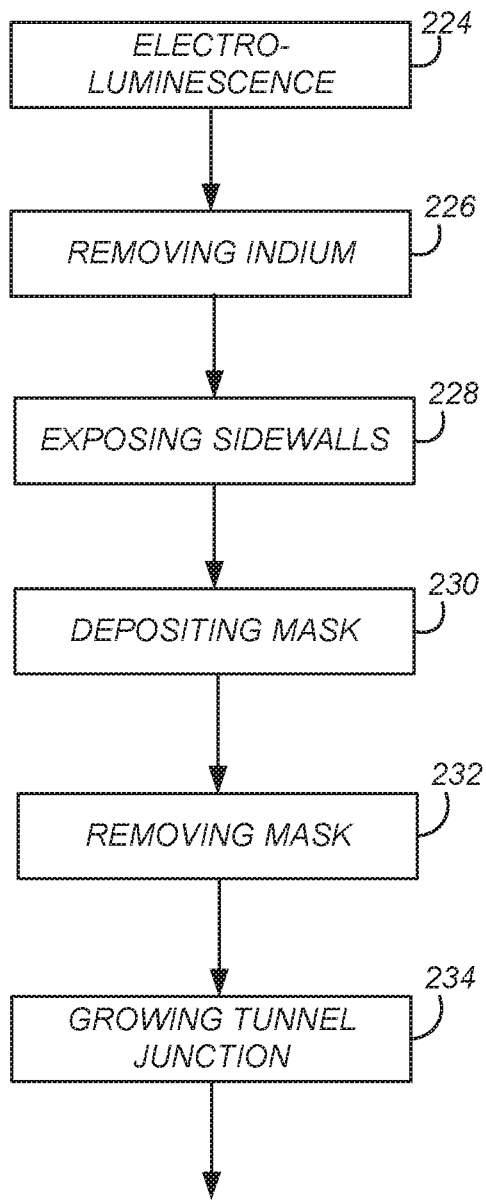
Figure 2:
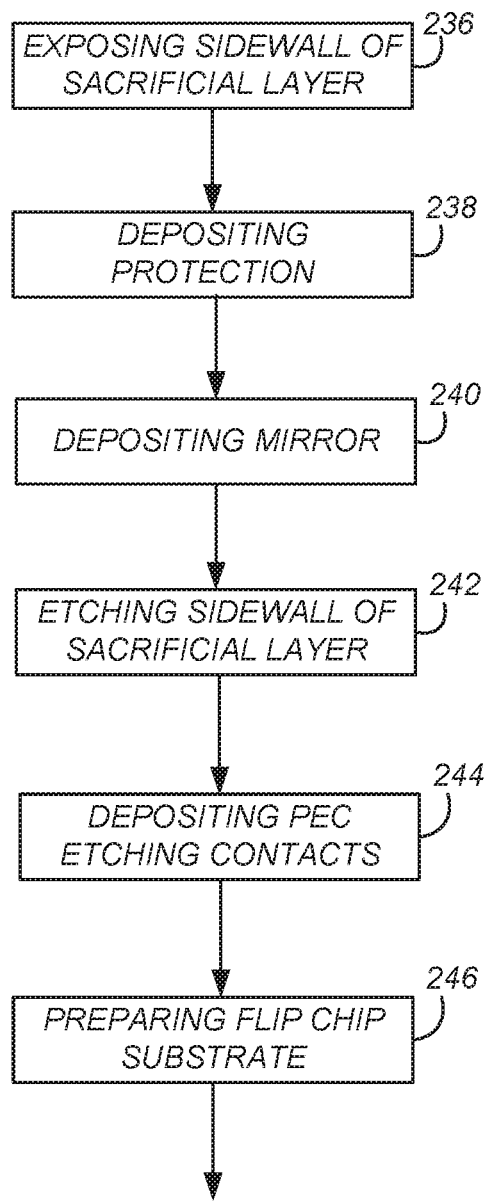
Figure 2:
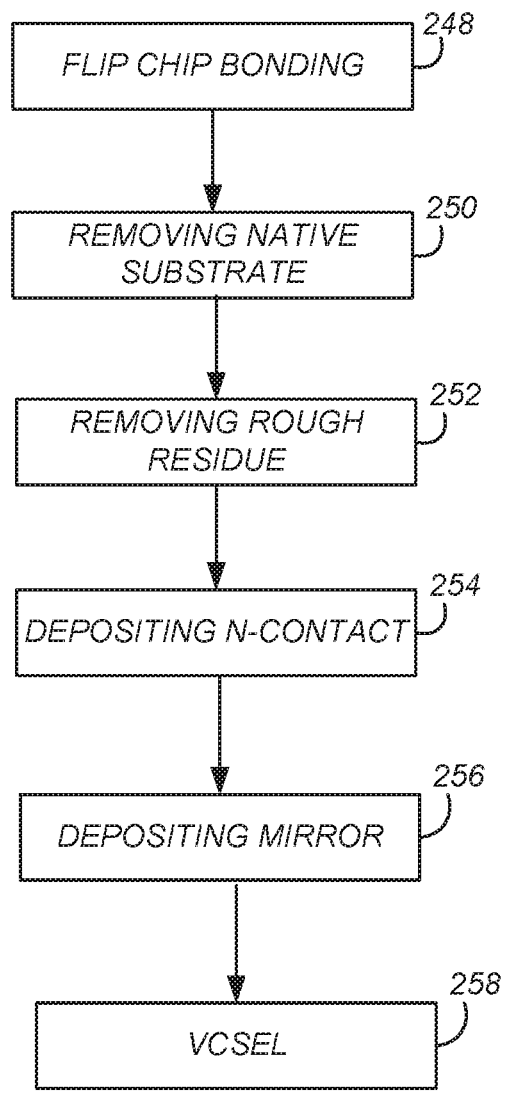

FIG. 2 illustrates a method of fabricating a VCSEL, referring also to FIG. 1A and FIG. 1B.

Block 200 represents obtaining a substrate 102 (e.g., a III-nitride substrate such as a GaN substrate). For the devices 100b measured in the results section G, the substrate 102 comprising an m-plane GaN substrate with a miscut of 1° in the negative c-direction was used.

Block 202 represents optionally growing a template layer (e.g., GaN template) on or above the substrate 102. For the devices measured in the results section G, the template is a GaN layer having a thickness of 1264.6 nm.

Block 204 represents growth of one or more sacrificial layers 104 on the template. In one example, the sacrificial layer is a single quantum well. In another other example, the sacrificial layer comprises a multi quantum well (MQW). For the devices measured in the results section G, sacrificial 3 period MQW (absorption λ=415 nm) including 5 nm QWs and 7 nm barriers were grown on the template.

Block 206 represents growth of the n-type layer 106 (e.g., $n^{++}$GaN or $n^{++}$-type III-nitride having higher n-type dopant concentration than n-type layer 110) on or above the sacrificial layer 104. For the devices 100b measured in the results section G, the $n^{++}$-GaN layer had a thickness of 26 nm.

Block 208 represents depositing the etch stop layer 108 (e.g., n-type AlGaN layer or n-AlGaN), For the devices 100b measured in the results section G, the etch stop layer 108 is an n-AlGaN layer having a thickness of 15 nm on the $n^{++}$-GaN layer of Block 206.

Block 210 represents depositing a first n-type III-nitride layer 110 (e.g., n-GaN or n-type GaN) on the etch stop layer 108 (e.g., n-AlGaN_.

Block 212 represents depositing an active region comprising a III-nitride active layer 112 on the first III-nitride layer 110. Examples include, but are not limited to, the III-nitride layer including one or more InGaN/GaN QWs. For the devices measured in the results section G, the active region is a two period InGaN/GaN MQW including 14 nm thick QWs and 1 nm barriers, and wherein the Indium and Gallium compositions are such that the QWs have a bandgap such that peak absorption of the QWs is at a wavelength of 405 nm. In one or more examples, the QWs have a thickness of at least 8 nm, e.g., in a range of 8-20 nm.

Block 214 represents optionally depositing an electron blocking layer 114 (e.g., p-type AlGaN or p-AlGaN) on the active region (e.g., III-nitride layer 112). For the devices measured in the results section G, the electron blocking layer 114 is a p-AlGaN layer having a thickness of 5 nm.

Block 216 represents depositing a p-type layer 116 (e.g., p-type III-nitride layer such as p-GaN) on the electron blocking layer 114 (e.g., p-AlGaN). For the devices measured in the results section G the p-GaN layer has a thickness of 62 nm.

Block 218 represents depositing a $p^{++}$-type layer 118 (e.g., $p^{++}$-GaN layer) on the p-type layer 116 (e.g., p-GaN), For the devices measured in the results section G, the $p^{++}$-GaN layer has a thickness of 14 nm.

Block 220 represents optionally performing photoluminescence to check the wavelength and quality of the active region.

Block 222 represents annealing the grown structure to activate the p-GaN. For the results presented herein, the structure was thermally annealed at 600° C. for 15 min.

Block 224 represents optionally performing electroluminescence using soldered indium contacts to check the light output power, wavelength, full width at half maximum (FWHM), and voltage characteristics of the device structure.

Block 226 represents removing the indium contacts, if necessary. For the devices measured in the results section G, aqua regia was used to remove the indium contacts.

Block 228 represents etching to expose the sidewalls 134 of the active region (in order to later deposit dielectric 132 (e.g., $SiN_x$) on the sidewalls to protect the active region during PEC etching). For the devices measured in the results section G, a dry etch was performed to expose the sidewall 134 of the III-nitride active layer 112 comprising a MQW.

Block 230 represents depositing a mask defining a current aperture 130 in the device structure 100. For the devices 100b measured in the results section G, a Ti/Au hardmask was deposited over the aperture and aluminum ion implantation was performed to serve as the current aperture.

Block 232 represents removing the mask. For the devices measured in the results section G, the Ti/Au hardmask was removed using aqua regia.

The layers deposited to this point were grown by MOCVD.

Block 234 represents growing a tunnel junction intracavity contact 120a by molecular beam epitaxy (MBE) (e.g., $n^+$-GaN layer between $n^{++}$-GaN layers). For the devices measured in the results section G, the following sequence of layers were grown by MBE: $n^{++}$GaN layer ($1E19$ cm$^{-3}$ doping concentration, 39.5972 nm thick; followed by $n^+$GaN ($2.5E18$ cm$^{-3}$ doping concentration, 61.7376 nm thick); followed by $n^{30}$ $^+$GaN ($1.1E20$ cm$^{-3}$ doping concentration 39:5972 nm thick), wherein the top most final layer is the contact layer ($n^{++}$GaN) for the tunnel junction.

Block 236 represents etching (e.g., dry etching) to remove the MBE regrown material deposited on the sidewall (when growing contact 120) to prevent a current leakage path. For the devices measured in the results section G, a dry etch was performed.

Block 238 represents depositing a protection layer 132 (e.g., dielectric such as SiNx, silicon nitride) on the sidewalls 134. For the devices measured in the results section G, Ion beam deposition (IBD) was used to deposit the protection layer 132 comprising $SiN_x$ on the sidewall so as to protect the sidewall 134 of the active region (so that the active region does not etch during PEC etching during native m-plane GaN substrate removal).

Block 240 represents depositing a mirror 122 (e.g., distributed bragg reflector DBR) on the p-side/p-type side 170 of the device structure 100. For the devices measured in the results section G, IBD was used to deposit a 16-period (16P) $SiO_2/Ta_2O_5$ (66.8/45.6 nm) DBR on the p-side.

Block 242 represents etching to expose the sidewalls 140 of the sacrificial layer 104 comprising the MQW. For the devices measured in the results section G, a dry etch was performed to expose the sidewalls 142 of the sacrificial MQW.

Block 244 represents depositing a p-type contact (p-contact) 124 and cathode 144 for the PEC etching. For the devices measured in the results section G, 20 nm/1000 nm Ti/Au was deposited to serve as both the p-contact 124 and as the cathode 144 for PEC etching.

Block 246 represents preparing the flip chip substrate 136 (e.g., sapphire). For the devices measured in the results section G, the metal layer 138 comprising 20 nm/100 nm/15000 nm/100 nm Ti/Ni/Au/In/Au was deposited on double-side polished sapphire 146 to serve as the flip-chip substrate 136. The purpose of the uppermost 100 nm Au layer of the metal layer 138 was to prevent indium oxidation (indium readily diffuses into the gold layer to form $AuIn_2$ as-deposited).

Block 248 represents flip-chip bonding the flip chip substrate 136 to the grown epitaxial structure 100 under appropriate conditions. For the devices measured in the results section G, flip chip bonding was conducted with the following conditions: temperature of 210° C., 30 Newtons force, for 300 seconds. The step may comprise selecting a metal alloy system that had a low melting temperature sufficient for the bonding process.

Block 250 represents native substrate 100 removal. For the example illustrated in FIG. 1B, the native GaN substrate was removed by performing PEC etching to selectively etch the sacrificial MQW. For the devices measured in the results section G, PEC etching was performed using 1 M KOH and a 390 nm LED array.

Block 252 represents removing a rough residue (likely gallium oxide) that appears after PEC undercut etching. For the devices measured in the results section Cr, swabbing the sample in Tergitol detergent was performed to remove the rough residue from n-side surface(s) 150, 152 of the n-GaN. Submerging the sample in KOH can also remove most of the oxide.

Block 254 represents depositing the n-contact 128. For the devices 100a measured in the results section G, 10/500 nm Ti/Au was deposited to serve as n-contact.

Block 256 represents depositing a mirror 126 (e.g., DBR) on the n-side 148 of the device 100a. For the devices 100a measured in the results section G, a 12-period $SiO_2/Ta_2O_5$ (66.8/45.6 nm) DBR was deposited on the n-side 148 using IBD.

Block 258 represents the end result, a VCSEL 100a (e.g., as illustrated in FIG. 1B).

b. Exemplary Embodiments

Figure 12:
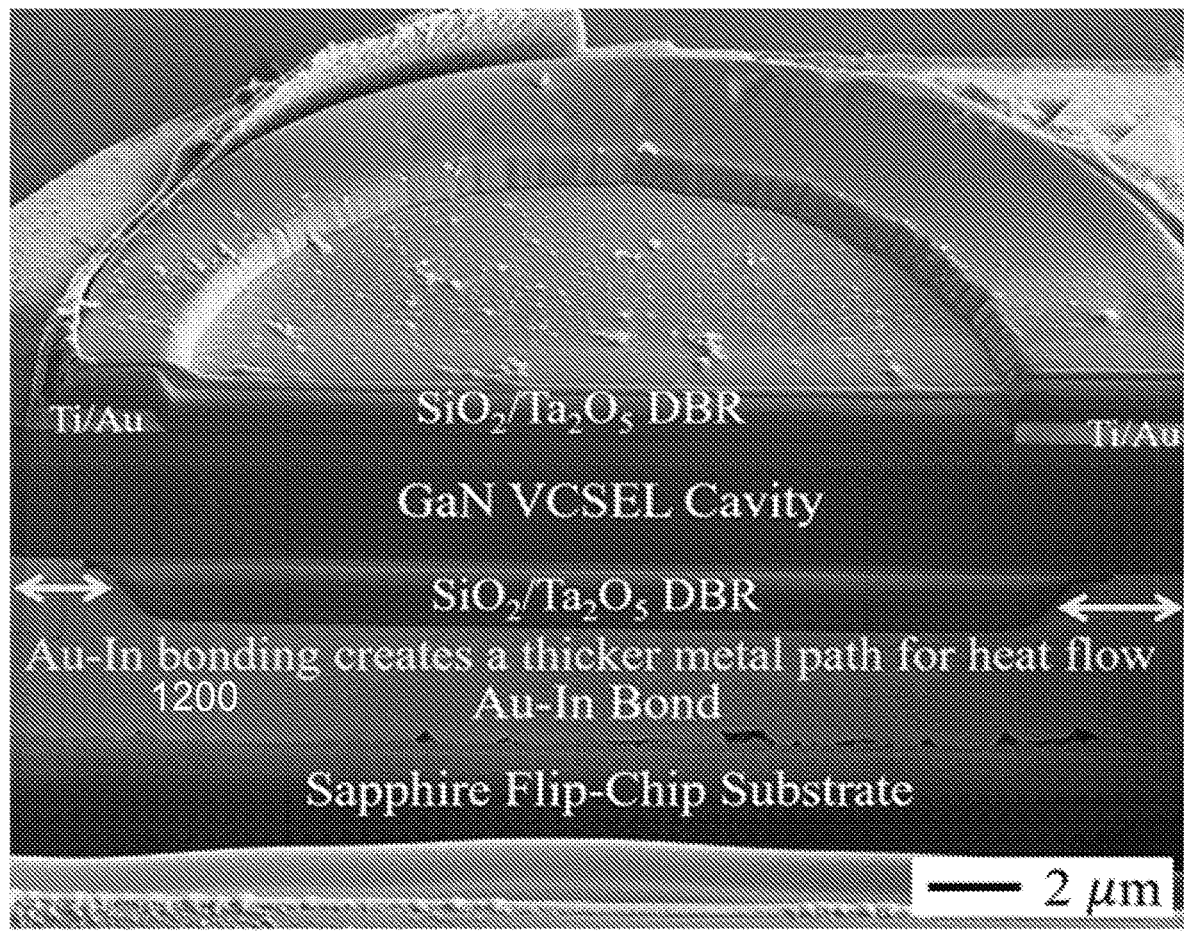
FIG. 12. Image of VCSEL bonded to flip chip substrate using Au—In solid-liquid interdiffusion (SLID) bonding FIG. 13. Au—In phase diagram.

Steps can be added or omitted so that the VCSEL 100 can be embodied in many ways including, but not limited to, the following examples (referring to FIG. 1A, FIG. 1B, and FIG. 12).

1. A VCSEL 100a on a mount (e.g., flip chip substrate 136); and a thermally conductive bond 160, 1200 between the mount and the VCSEL 100a, the bond 160, 1200 comprising a layer 138 of metal having a thermal conductivity such that heat, generated during operation of the VCSEL, is transferred from the VCSEL to the mount and the VCSEL emits continuous wave electromagnetic radiation.

2. The device 100a of example 1, wherein the thermally conductive bond 160, 1200 comprises no cracks or fewer cracks than a bond between the VCSEL and the mount formed using Au—Au thermal compression bonding.

3. The device 100a of one or any combination of the previous examples, wherein the thermally conductive bond 160, 1200 comprises metal formed from a liquid metal phase.

4. The device 100a of one or any combination of the previous examples, wherein the VCSEL 100a is bonded to the mount by solid-liquid interdiffusion bonding (e.g., realized by short liquid phase of one low melting metal (e.g., indium) and immediate solidification caused by diffusion and intermixing with a second high melting point metal (e.g., gold), generating the intermetallic phase).

5. The device 100*a* of one or any combination of the previous examples, wherein the VCSEL comprises a first mirror 122 and a second mirror 126 defining a cavity for the electromagnetic radiation emitted from the VCSEL, and the VCSEL 100*a* is bonded to the mount by forming the bond 160, 1200 comprising a metal layer 138, in a liquid state, around the first mirror 122. In one or more examples, the metal layer 138 is conformal with the first mirror 122.

6. The device of one or any combination of the previous examples, wherein: the VCSEL 100*a* comprises a first mirror 122 and a second mirror 126 defining a cavity for the electromagnetic radiation, the bond 160, 1200 comprises a metal layer 138, and one of the first mirror 122 or the second mirror 126 is embedded in the metal layer 138.

7. The device 100*a* of one or any combination of the previous examples, wherein the VCSEL comprises a first mirror 122 and a second mirror 126 defining a cavity for the electromagnetic radiation emitted from the VCSEL, and the bond 160, 1200 comprises a metal layer 138 cast around the first mirror 122 or the second mirror 126 acting, the first mirror 122 or second mirror 126 as a mold for the metal layer 138.

8. The device 100*a* of one or any combination of the previous examples, wherein the bond 160, 1200 comprises an intermetallic compound having a solid phase containing two or more metallic elements.

9. The device 100*a* of one or any combination of the previous examples, wherein the bond 160, 1200 comprises a first metal diffused into a second metal so as to intermix with a second metal, the first metal having a lower melting point than the second metal.

10. The device 100*a* of one or any combination of the previous examples, wherein first metal comprises indium and the second metal comprises gold.

11. The VCSEL 100*a* of one or any combination of the previous examples, comprising a light emitting III-nitride active region 112 including quantum wells (QWs), wherein each of the quantum wells have a thickness of more than 8 nm (however, thicknesses of less than 8 nm are also possible and achieve continuous wave emission of electromagnetic radiation).

12. The VCSEL of example 11, wherein the thickness of the quantum wells is in a range of 8-20 nm.

13. The VCSEL 100*a* of one or any combination of the previous examples, wherein active region 112 has a nonpolar or semipolar crystal orientation.

14. The VCSEL 100*a* of one or any combination of the previous examples, wherein the VCSEL has a cavity length L of at least 7 $\lambda$, where $\lambda$ is a peak wavelength of light/electromagnetic radiation emitted from the active region when the light/electromagnetic radiation is in the active region and the peak wavelength is the wavelength of the light/electromagnetic radiation having the highest intensity.

15. The VCSEL 100*a* of example 14, wherein the cavity length L is in a range of 20 $\lambda$-100 $\lambda$.

16. The VCSEL 100*a* of one or any combination of the examples 1-15, wherein the VCSEL further includes the active region 112 between a flat III-nitride n-type layer 110 and a III-nitride p-type layer 116, a second III-nitride n-type layer 120 forming a tunnel junction with the III-nitride p-type layer, the second III-nitride n-type layer including a contact layer for the tunnel junction, and a top surface 162 of the contact layer (or top surface 162 of layer 120) having a root mean square surface roughness (RMS) of less than 2 nanometers (nm) when the VCSEL is a nonpolar device or less than 1 nm when the VCSEL is a semipolar device.

17. The VCSEL 100*a* of one or any combination of the previous examples, wherein the active region 112 is between a III-nitride n-type layer 110 and a III-nitride p-type layer 116, an n-side surface 150, 152 of the III-nitride n-type layer 110, 106 is exposed after etching to at least partially remove the substrate 102 on which the active region 112/VCSEL structure 100 was grown, and the n-side surface 150, 152 is surface treated and has an RMS surface roughness less than 1 nm.

18. The VCSEL 100*a* of examples 16 or 17, wherein the surface roughness of surface 162 and/or surface 150, 152 is over a 5 µm×5 µm, a 1 µm×1 µm, or 10 µm×10 µm area, (µm is micrometers).

19. The VCSEL 100*a* of example 16-17, wherein the surface treatment removes an oxide residue after the etching.

20. The VCSEL 100*a* of one or any of the examples 1-19, further comprising: a mirror 122; a metal layer 124 on the mirror 122; a flip chip substrate 136; a bonding layer 160, 1200 including gold on the flip chip substrate 136; a bonded interface between the bonding layer 160, 1200 and the metal layer 124, wherein the bonded interface includes indium bonded to the gold.

21. The device 100*a* of any of the preceding examples, further comprising a charge injection layers 110, 116 coupled to a light emitting active region 112, wherein the active region emits the light in response to electrons and holes injected into the active region through charge injection layers 110, 116 (electrons through layer 110 and holes through layer 116).

22. A VCSEL 100*a* comprising a light emitting III-nitride active region including quantum wells (QWs), wherein each of the quantum wells have a thickness of more than 8 nm.

23. The VCSEL 100*a* of example 22, in combination with one or any combination of examples 1-10 or 11-21.

24. A method of a fabricating a Vertical Cavity Surface Emitting Laser (VCSEL) structure, comprising growing a sacrificial layer on a semipolar or nonpolar III-nitride substrate; growing a III-nitride VCSEL structure including an active region between an n-type layer and a p-type layer, wherein the active region includes a quantum well having a thickness greater than 8 nm; at a temperature of less than 750° C., growing a tunnel junction intracavity contact 120*a* on the p-type III-Nitride using an indium surfactant; depositing a mirror on a p-type side of the VCSEL structure; covering sidewalls of the active region with a dielectric layer; depositing metal on the mirror; flip chip bonding a flip chip substrate to the metal on the mirror using solid-liquid interdiffusion bonding, and photoelectrochemically etching the sacrificial layer so as to at least partially remove the nonpolar or semipolar III-nitride substrate; and removing, using a surface treatment, a rough residue on an n-type side of the VCSEL structure or on the surface of the n-type layer exposed during the etching.

25. The method of example 24, wherein the removing comprises treating the surface with Tergitol detergent or KOH.

26. The method of examples 24 or 25, wherein: the VCSEL structure is grown with a cavity length of at least 7 $\lambda$, where $\lambda$ is a peak wavelength of light emitted from the active region when the light is in the active region; and the peak wavelength is the wavelength of the light having the highest intensity.

27. The method of examples 24, 25, or 26 wherein a surface of the n-type layer has a root mean square (RMS) surface roughness of less than 1 nm after the surface treatment.

28. The method of example 27, wherein the surface roughness is over a 5 µm×5 µm, a 1 µm×1 µm, or 10 µm×10 µm area.

29. The method of any of the examples 24-28, wherein the VSCEL emits continuous wave electromagnetic radiation.

30. The method or device of one or any combination of the previous examples 1-29, wherein the mirrors 122, 126 are thermally insulating and/or comprise a dielectric.

FIG. 1A shows the device structure prior to the flip-chip bond stage. After flip-chip bonding to a sapphire substrate, the native m-plane GaN substrate was removed via PEC etching. FIG. 1(b) shows the fully completed device. Although this device used sapphire as the flip-chip substrate, sapphire is riot a good heat sink. Better options for the substrates are copper, SiC, diamond, AlN, and other materials with high thermal conductivity.

In one or more examples, the VCSEL has a cavity length of at least 7 λ, in a range of 7 λ-100 λ, or in a range of 20 λ-100 λ, where λ is a peak wavelength of the light in the active region and emitted from the active region. In one or more embodiments, a VCSEL having the cavity length of at least 7 λ is capable of emitting continuous wave electromagnetic radiation.

c. Further Exemplary Bonding Method Embodiment

Figure 3:
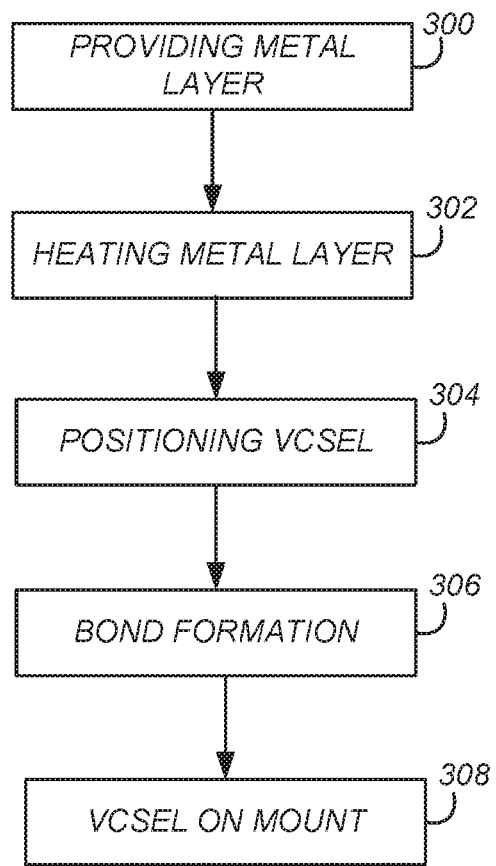
FIG. 3. Example bonding process flow.

FIG. 3 illustrates a method of fabricating a VCSEL according to one or more examples, comprising bonding a VCSEL to a mount using metal. The bonding comprises the following steps.

Block 300 represents providing a metal layer on the mount, the metal layer comprising a first metal and a second metal.

Block 302 represents heating the metal layer so that the first metal is in liquid metal state.

Block 304 represents positioning the VCSEL on the metal layer including the first metal in the liquid state.

Block 306 represents allowing the metal layer to solidify and form a bond between the VCSEL and the mount.

Block 308 represents the end result, a VCSEL on a mount. The VCSEL/method on the mount can be embodied in many ways including, but not limited to, the following examples.

1. The method wherein the VCSEL comprises a first mirror and a second mirror defining a cavity for electromagnetic radiation emitted from the VCSEL, and the positioning comprises positioning the first mirror on the metal layer using a force or pressure when the first metal layer is in the liquid metal state, so that the first metal layer is embedded in the metal layer after the metal layer has solidified.

2. The method of Example 1 wherein the steps 300-308 are implemented so that the VCSEL is bonded to the mount by solid-liquid interdiffusion bonding, the first metal comprises indium, and the second metal comprises gold.

3. The method resulting in the VCSEL on a mount according to one or any combination of Examples 1-21 in section F part b above entitled "Exemplary Embodiments."

In one example, the bonding metal layer 160, 1200 thickness that worked best was ~2 micrometers thick indium on the flip-chip substrate (and ~1 micron of Au on the GaN device), In one or more examples, the bottom DBR mirror is ~1.8 microns thick, so in one or more examples as 2 to 3 microns thickness of bonding metal 160, 1200 would enable the bottom DBR 122 to become completely embedded within metal. Thinner bonding metal thicknesses may also work in some examples but might result in a thinner pathway for heat transport.

G. Results and Characterization

The I-L, I-V, and spectrum were measured under both pulsed and CW operation. For a light-emitting diode with equivalent active region design, the pulsed spectrum was obtained at stage temperatures up to 60° C. to obtain the peak emission wavelength shift with increasing temperature.

VCSELs achieved lasing under both pulsed and CW operation. Lasing was stable for over 20 minutes under CW operation. The following section presents the results during electroluminescence under pulsed and CW operation.

a. Pulsed Operation Measurement (10 kHz Pulse Repetition, 500 ns Pulse Width)

Figure 4A:
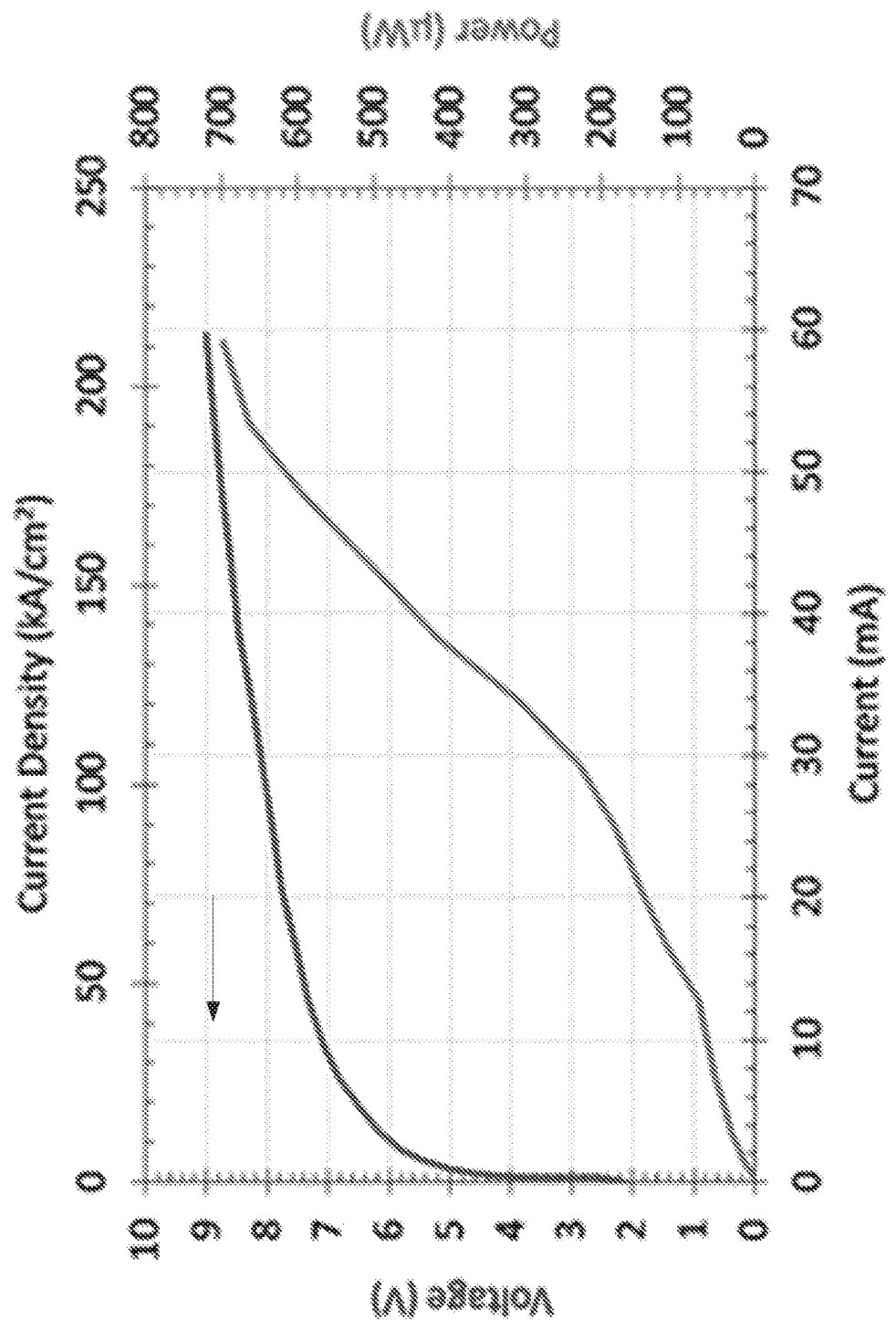
FIG. 4A Photodetector measurement of pulsed I-V and I-L curves of a VCSEL with a 6 μm aperture diameter and 23 λ cavity length. The $I_{th}$ was 12 mA (42.4 kA/cm$^2$) and the maximum output power was 700 μW.

FIG. 4A illustrates the peak output power was 700 µW for the 6 µm aperture diameter VCSEL shown in FIG. 1. Although not shown, the highest peak output power was 1 mW for a 10 µm aperture diameter device. The previous best m-plane VCSEL had a peak output power of 550 µW [10]

Lasing emission from the device (fabricated according to FIG. 1) was polarized along the a-direction with a polarization ratio of 100%.

Figure 4B:
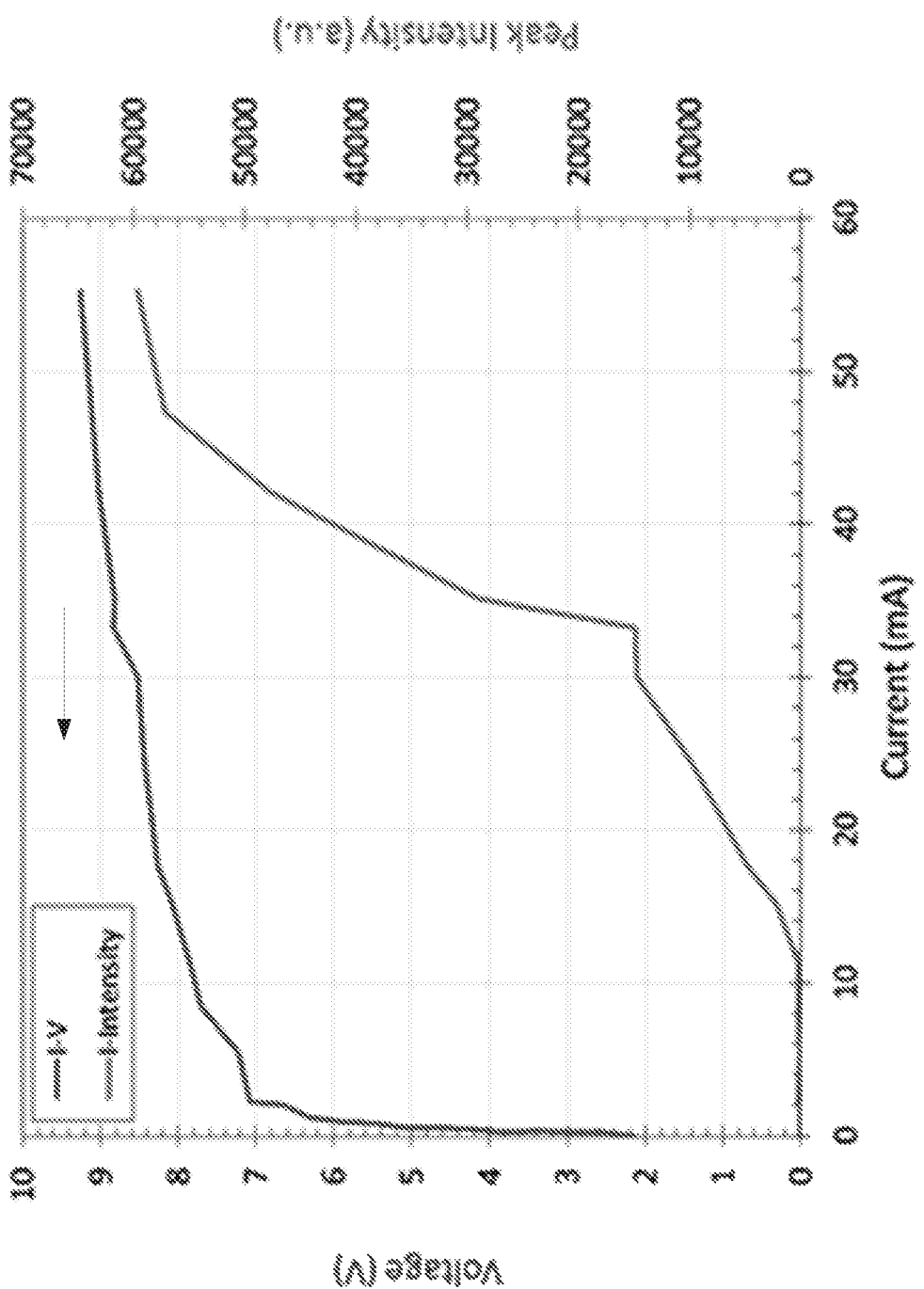
FIG. 4B. I-V and I-L curves generated by integrating the spectrometer intensity. By aligning the spectrometer fiber optic to the lasing peak, the measured spontaneous emission below threshold is greatly reduced compared to the large-area photodetector measurement.

FIG. 4B shows the threshold current was approximately 12 mA. (42.4 kA/cm$^2$). The L-I kink at threshold in FIG. 2(a) at 12 mA is less pronounced because the large-area photodetector measures additional light that escapes the device from areas uncovered with metal, including the sidewall and top-side of the device. The L-I kink at threshold in FIG. 2(b) at 12 mA is much more well-defined because the spectrometer fiber optic was aligned to the lasing peak, which minimizes the measured spontaneous emission below threshold.

The differential efficiency of the device fabricated according to FIG. 1A-1B improves at currents greater than 30 mA due to the appearance of a dominating longer-wavelength longitudinal mode (differential efficiency below 30 mA: $\eta_d$=0.267% differential efficiency above 30 mA: $\eta_d$=0.775%). This is more than twice the differential efficiency of previous m-plane VCSELs that had a value of $\eta_d$=0.26% [10].

The device fabricated according to FIG. 1A-1B had a series resistance of $R_d$=27.38 Ω. This series resistance is improved (smaller) compared to previous m-plane VCSELs that had a value of $R_d$=37 Ω[10].

Figure 5A:
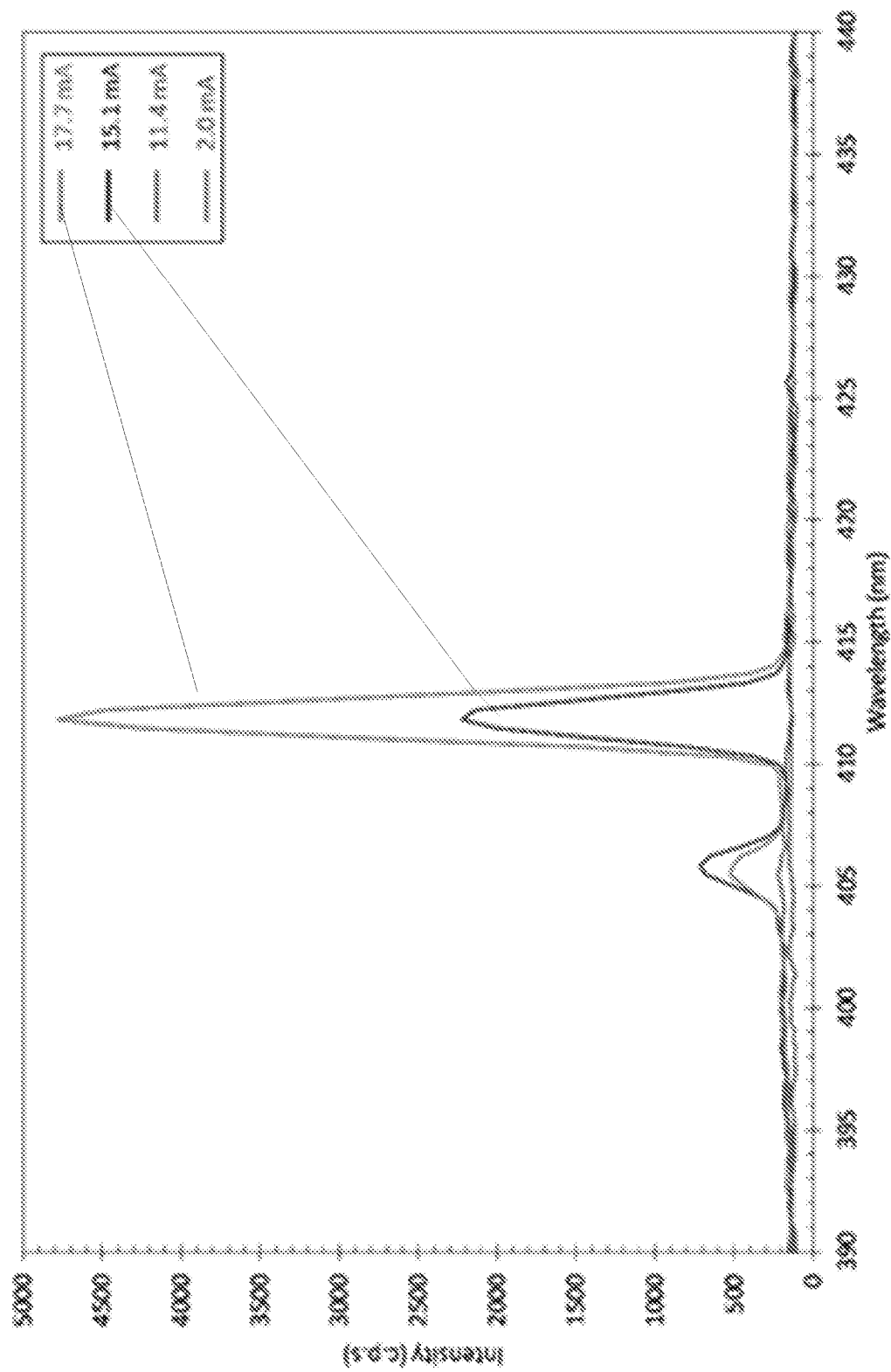
FIGS. 5A-5B. Spectrum under pulsed operation of a VCSEL with a 6 μm aperture diameter and 23 λ cavity length (FIG. 5A) near the threshold current and (FIG. 5B) for currents up to 42.1 mA.
Figure 5B:
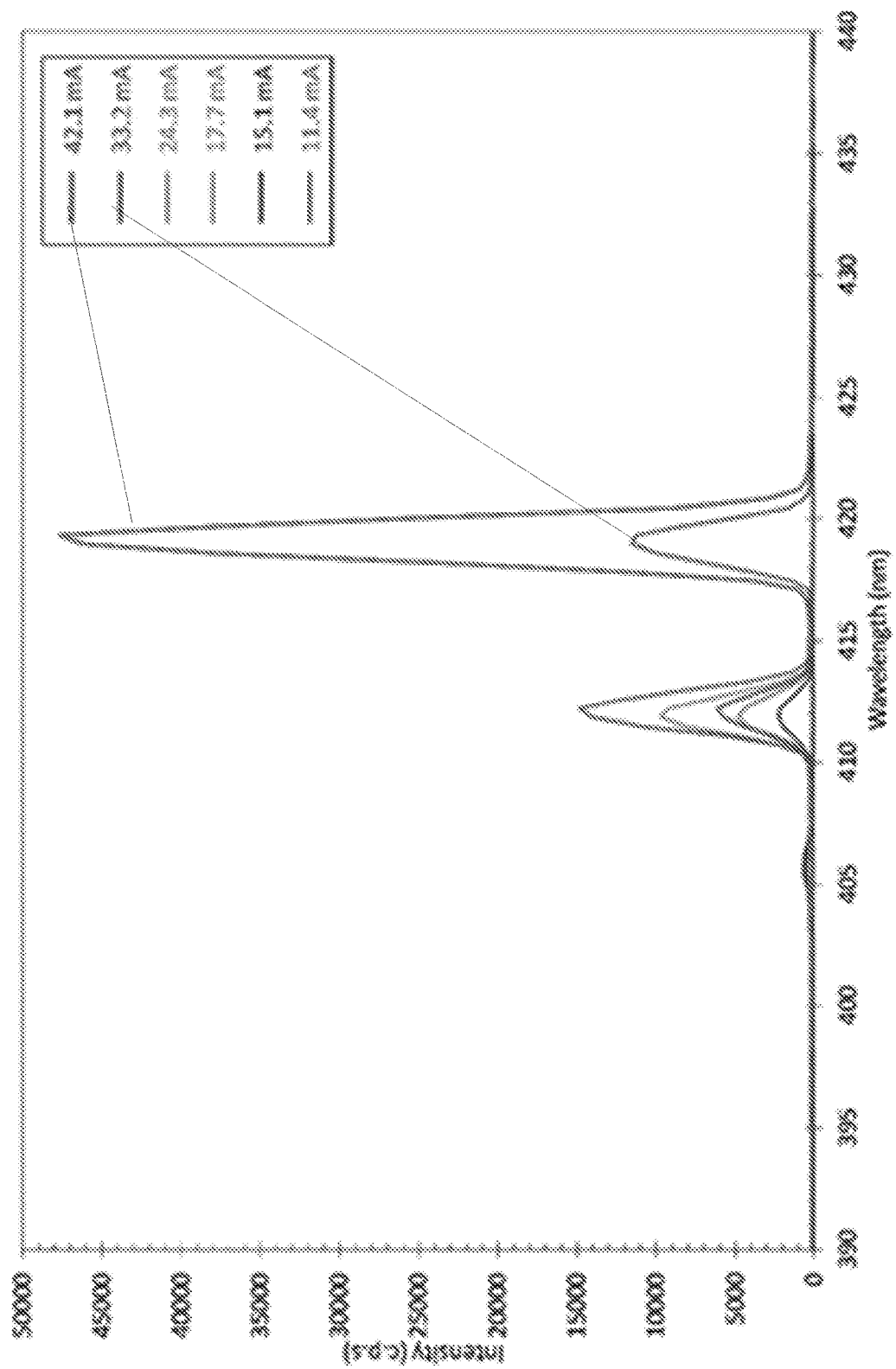

FIGS. 5A-5B shows the onset of lasing occurs between 11.4-15.1 mA, which is consistent with the threshold current of 12 mA from the I-L curve in FIG. 4B. The 406 nm and 412 nm lasing modes both appear at 15.1 mA. The 406 nm lasing mode likely appears first at a lower current than the 412 nm mode. As current is increased, the increased temperature causes the peak gain wavelength to redshift. This results in longer-wavelength modes increasing in intensity as shorter-wavelength modes decrease in intensity.

FIG. 5A illustrates that at 17.7 mA, the 406 nm mode decreases in intensity while the 412 nm mode increases in intensity. The effect of temperature-induced emission redshifting was further studied by measuring the spectrum at various pulse widths. While FIGS. 5A-5B corresponds to a 500 ns pulse width, for a 100 ns pulse width, the peak emission wavelength was 412 nm instead of 419.3 nm. For a 1000 ns pulse width, the threshold current was lower than 11 mA. Longer pulse width causes more heating which redshifts the gain and lowers the threshold for the longer-wavelength mode.

As shown in FIG. 5B, a dominant lasing mode appears at 419.3 nm at 33.2 mA. Although the peak spontaneous emission wavelength is 402 nm, the longer-wavelength modes dominate in intensity. Possible explanations include longer wavelengths experiencing lower levels of optical loss because (1) longer wavelengths have much lower levels of loss from the ion implanted region, and (2) TMM models indicate that longer wavelengths have less mode overlap with the highly absorptive tunnel junction in this design.

b. Continuous Wave (CW) Operation

Figure 6A:
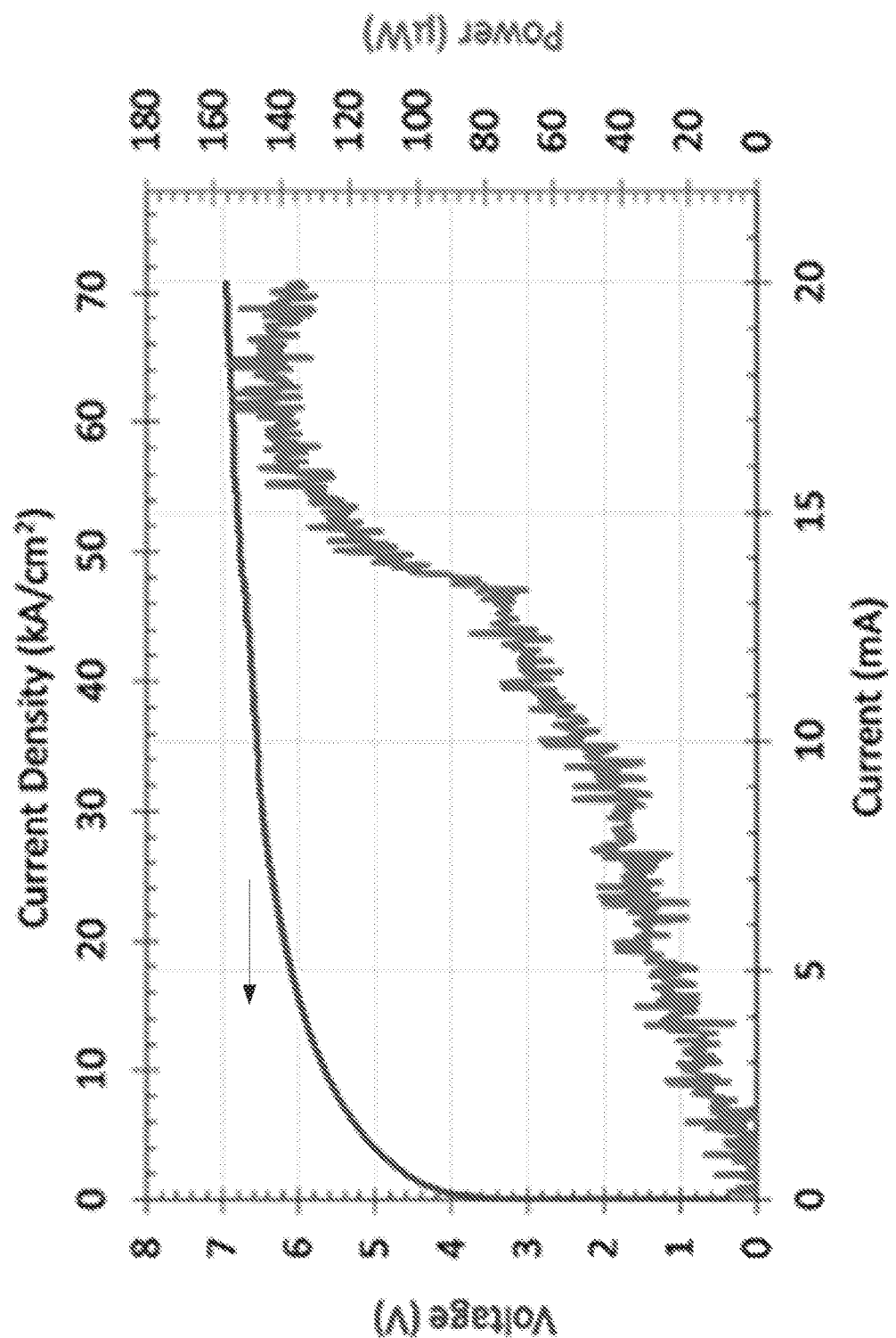
FIGS. 6A-6B. CW operation of a VCSEL with a 6 μm aperture diameter and 23 λ cavity length showing (FIG. 6A) I-V and I-L curves and (FIG. 6B) the spectrum at different currents.
Figure 6B:
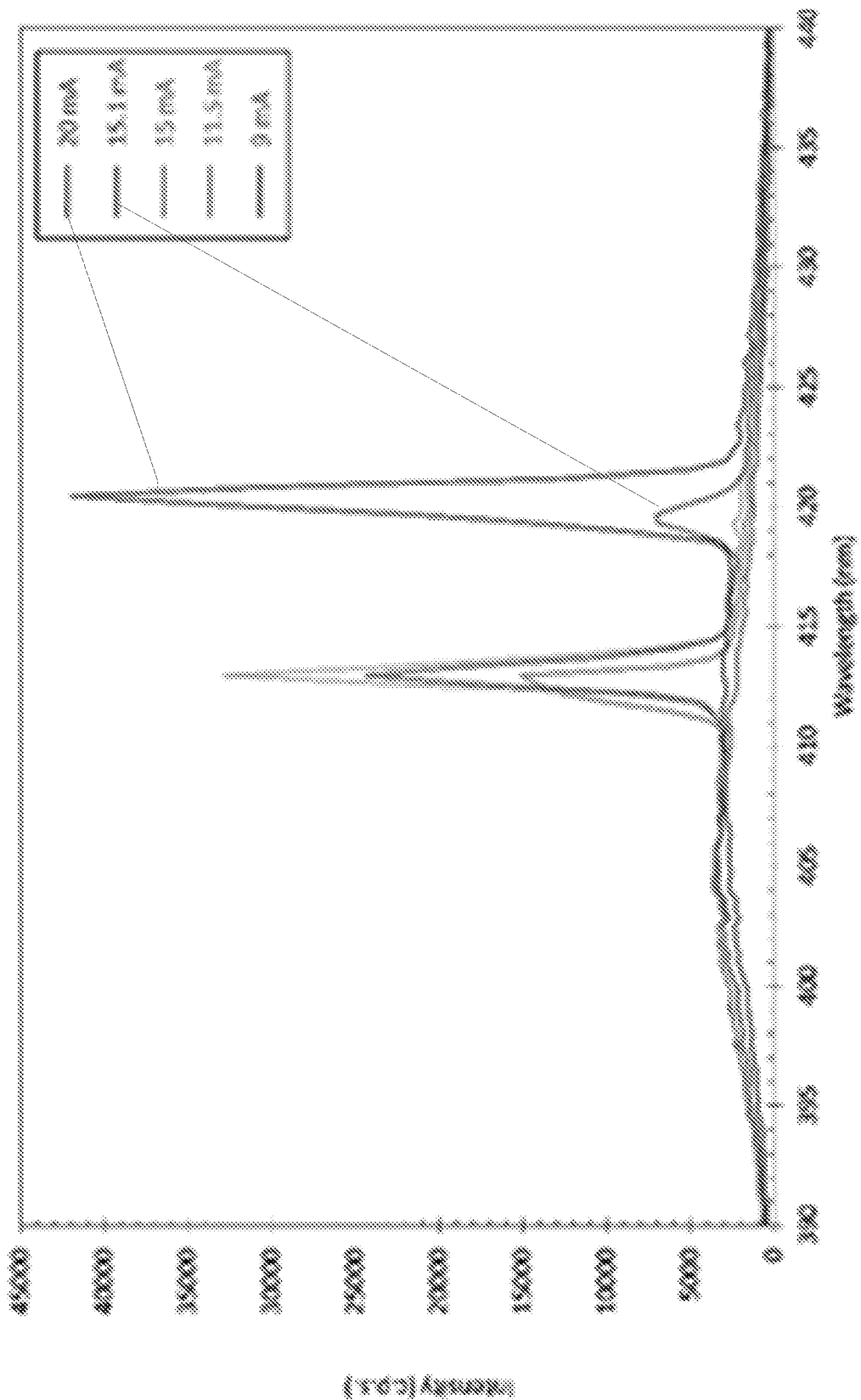

FIGS. 6A-6B illustrate the threshold current is approximately 10 mA and corresponds to a lasing wavelength of 412 nm. The L-I kink at 10 mA is obscured by the measurement of spontaneous emission power with the large-area photodetector, as described earlier.

Measuring the spectrum, as shown in FIG. 6B, provides further insight into, and verification of, the threshold for lasing. FIG. 6B shows the onset of lasing occurs at 11.5 mA, FWHM=0.74 nm, the 412 nm mode increases in intensity until a current of 15.1 mA, at which a lasing mode appears at a wavelength of 420 nm. The lasing mode at 420 nm has a FWHM=1.5 nm (spectrometer-limited).

Unlike the pulsed measurement, the lasing mode at 406 nm does not appear during CW operation due to the redshifted peak gain. For the longer-wavelength lasing mode, the lasing wavelength is 419.69 nm at 15.1 mA and it redshifts to 420.44 nm at 19.9 mA. This corresponds to a shift in Fabry-Perot wavelength with temperature of approximately 0.016 nm/° C., which is comparable to reported values [15].

At 13.5 mA CW operation, the differential efficiency improves due to the emergence of a lasing mode at 420 nm (average differential efficiency $\eta_d$=0.4095%; peak differential efficiency $\eta_d$=1.11392%).

c. Mode Structure

The lateral mode structure of the device fabricated according to FIGS. 1A-1B is much improved compared to previous m-plane VCSELs that showed filamentary lasing (a stochastic distribution of lasing within the aperture) [10].

Figures 7A, 7B:
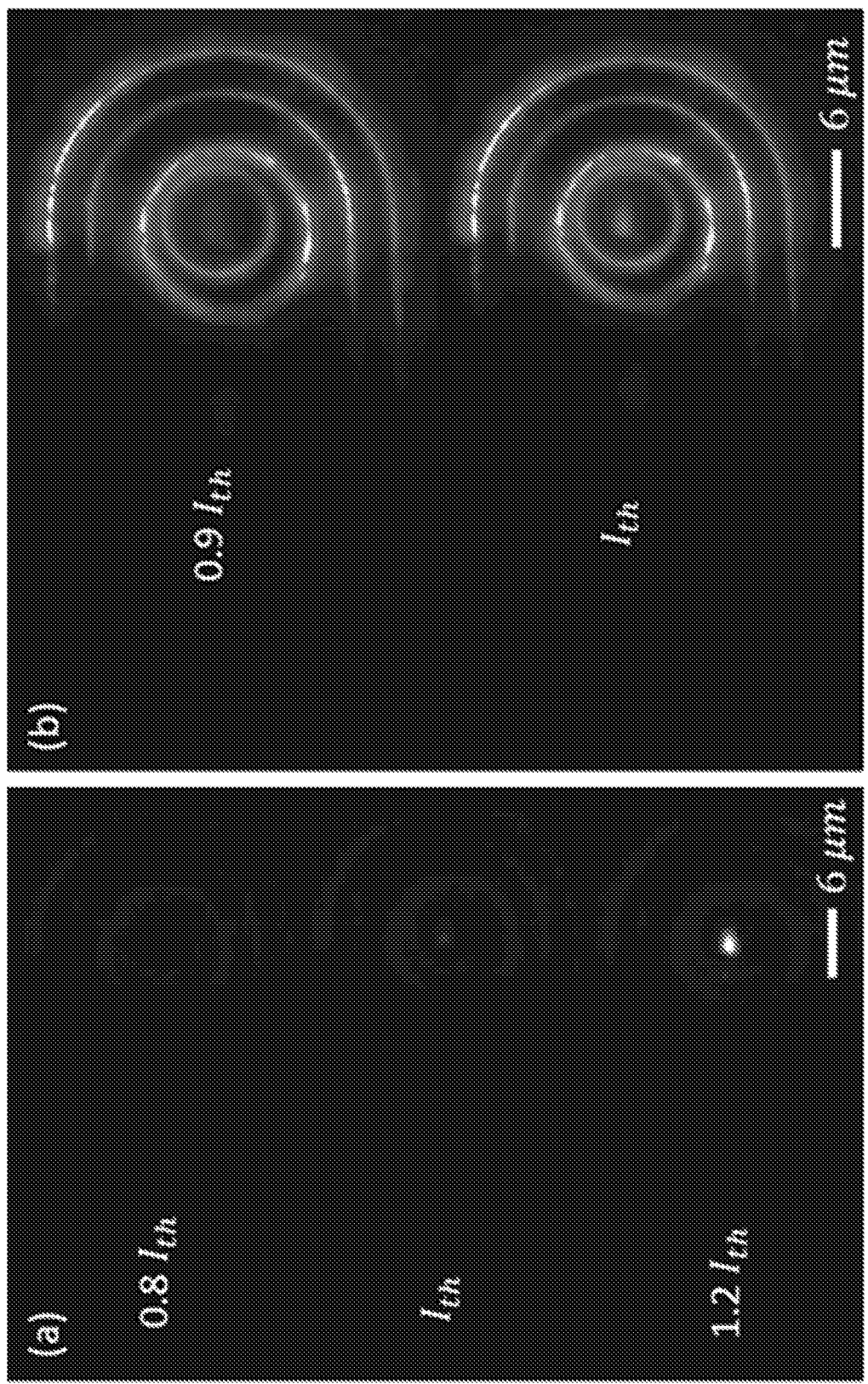
FIGS. 7A-7B. Optical microscope images of VCSEL aperture as a function of current at (FIG. 7A) low integration time and (FIG. 7B) higher integration time.

The lateral mode illustrated in FIG. 7A shows a well-defined lasing mode in the center of the aperture. The improved lateral mode profile could be attributed to the following:

Optimization of the MBE regrowth, which could have improve the current spreading and uniformity;

Removal of an oxide residue after PEC etching

FIG. 7B is an image of the mode taken at a higher integration time to show the spontaneous emission more clearly.

d. Thermal Impedance

Prior m-plane VCSELs were not able to achieve CW operation due to poor thermal performance. Under CW operation, the increased temperature redshifts the gain spectrum away from the cavity resonance, which prevents lasing. The poor thermal performance is mainly due to the thermally-insulating dielectric DBR on the p-side. Thermal modeling using COMSOL predicts that a negligible amount of heat flux occurs through the dielectric DBR. The main pathway for heat transport is around the dielectric DBR through the metal contact to the flip-chip substrate. Cross-sectional SEM analysis revealed that there are cracks and voids in the main metal pathway for heat transport, which likely prevented CW operation.

As illustrated herein, CW VCSEL operation was achieved using a design that improves thermal performance:

Longer cavity length (e.g., 23 λ instead of 7 λ)

Improved flip-chip bonding using indium-gold bonding instead of Au—Au bonding. In—Au bonding can be performed at a much lower force and temperature compared to Au—Au bonding. This results in fewer cracks in the device, and there is a much more robust pathway for heat transport.

Figure 8:
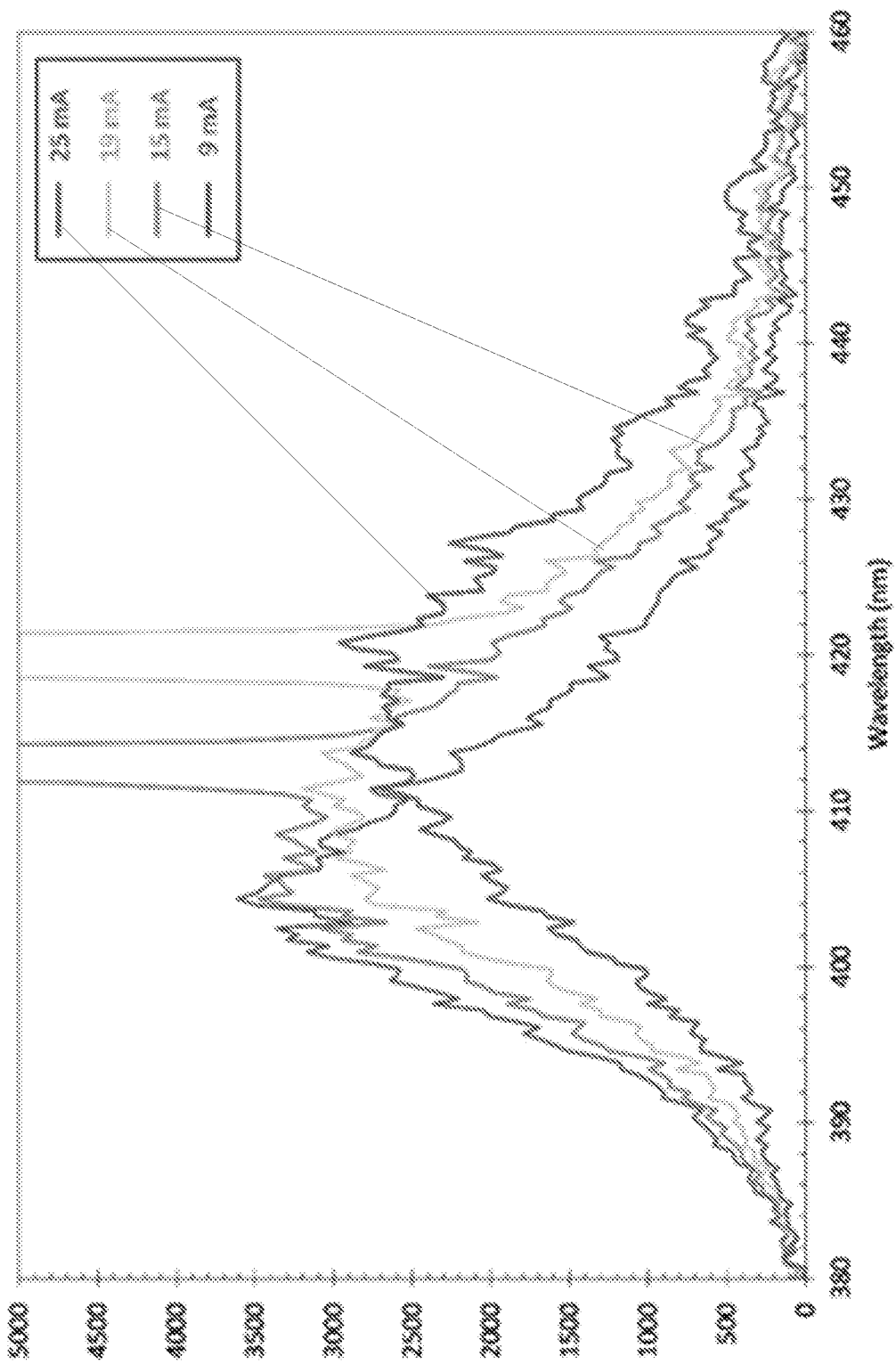
FIG. 8. Spectrum under CW operation for a VCSEL with a 6 μm aperture diameter and 23 λ cavity length. The spontaneous emission envelope redshifts with increasing current.

FIG. 8 illustrates the effect of heating by plotting the spectrum under CW operation. The spontaneous emission envelope redshifts with increasing current due to increased active region temperature. At 9 mA, the spontaneous emission is centered at 405.3 nm and redshifts to 416 nm at a current of 25 mA. The FWHM is 19.1 nm at 9 mA and broadens to a value of 29.9 nm at 25 mA. The shift in peak emission wavelength with increasing temperature was found to be 0.048 nm/° C. by measuring the spectrum of an m-plane LED at stage temperatures up to 60° C. Assuming a linear shift of 0.048 nm/° C., the VCSEL active region temperature can be estimated by its peak spontaneous emission wavelength. At 15 mA, the active region temperature is approximately 180° C. At 19 mA, the active region temperature is approximately 226° C. Based on these calculations, the thermal impedance is approximately 1500° C./W. A similar analysis was conducted on a VCSEL with a 7 λ cavity length which had a thermal impedance of approximately 3000° C./W.

e. Solid Liquid Interdiffusion (SLID) Bonding

Figure 9:
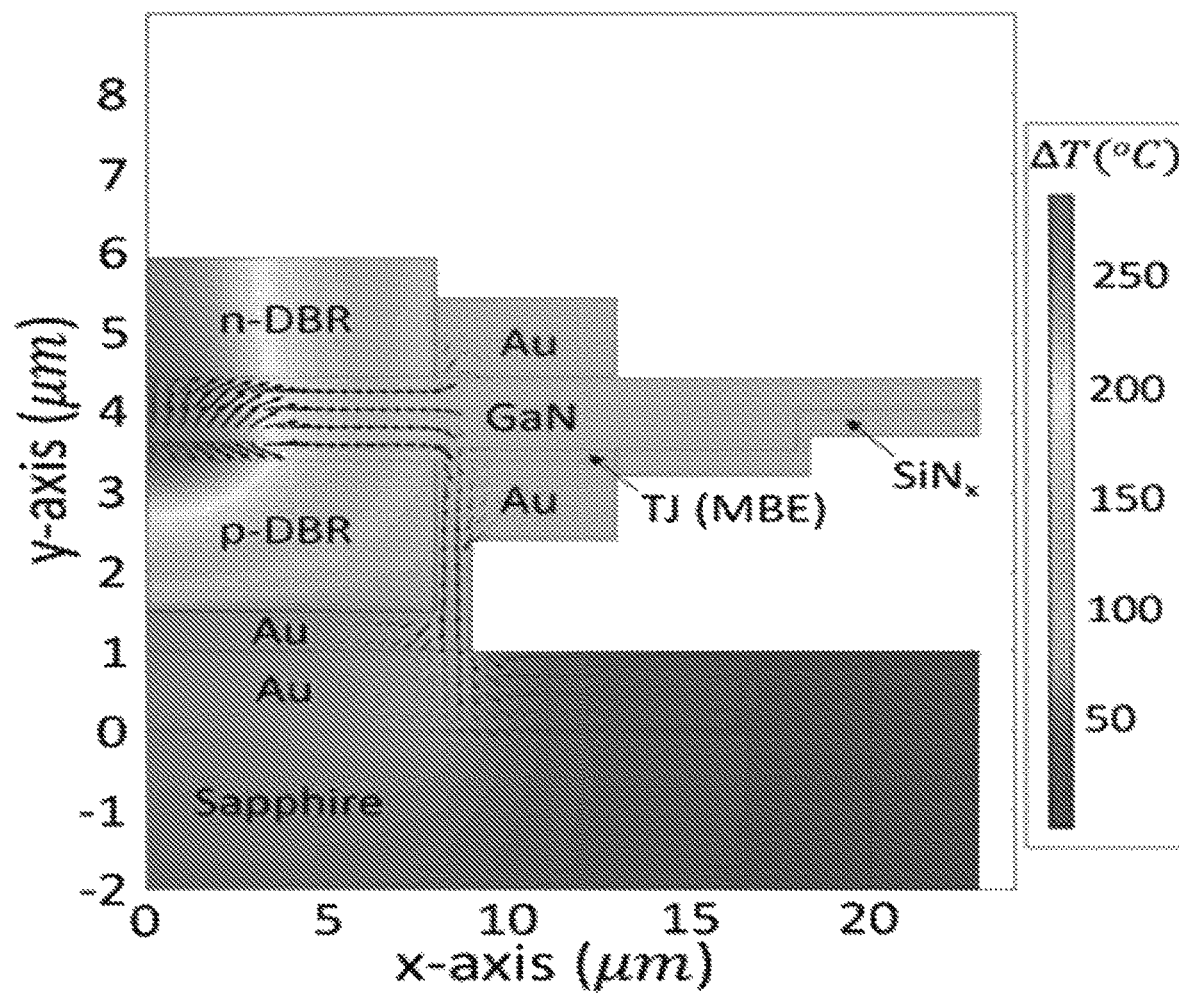
FIG. 9. Thermal modeling of a VCSEL bonded to a flip-chip substrate using Au—Au thermocompression bonding.
Figure 10:
FIG. 10. FIB cross-sectioning revealing cracks in the metal contact in the VCSEL bonded to a substrate using Au—Au thermocompression bonding.
Figures 11A, 11B:
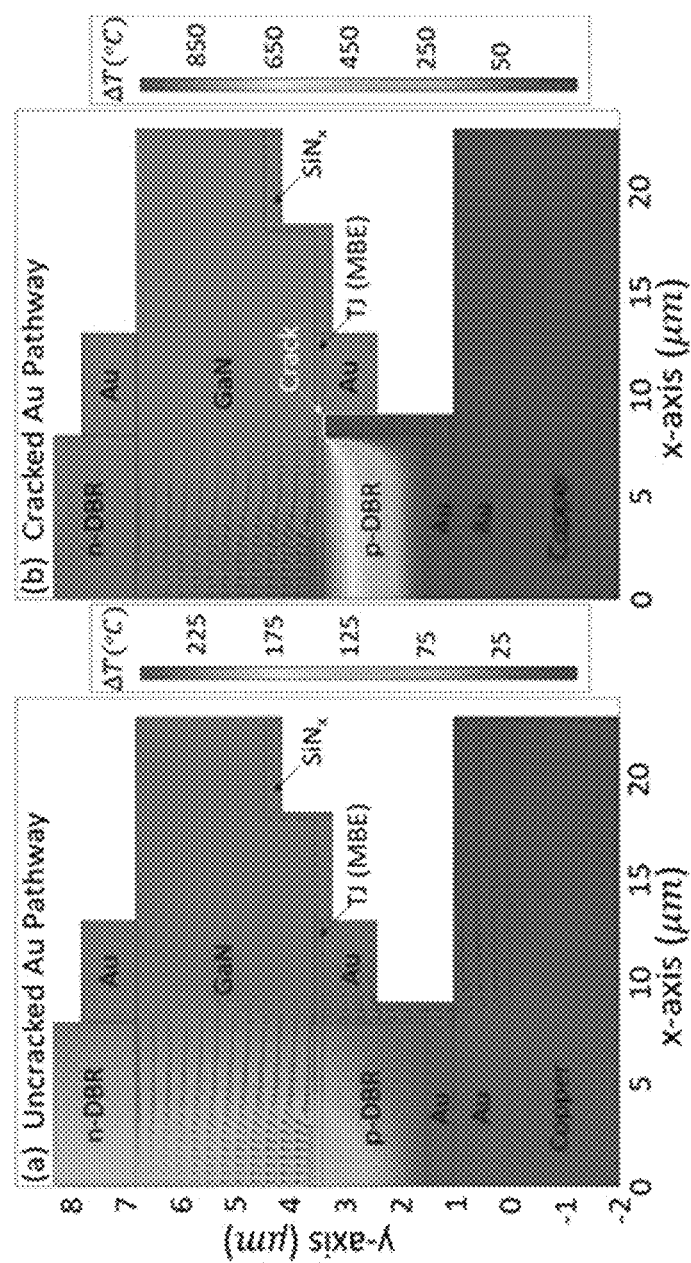

Prior GaN VCSELs could not lase under CW operation due to their poor thermal performance, which was notably due to the thermally-insulating dielectric DBR mirror on the bottom sides of the devices. COMSOL Thermal modeling (FIG. 9) shows that the main pathway for heat transport was around the bottom DBR through a thin metal contact toward the flip-chip substrate. FIG. 10 shows FIB cross-sectioning revealing cracks in that metal contact. Thermal modeling illustrated in FIG. 11A and FIG. 11B shows that cracks in that metal contact severely impair the thermal performance.

Au—Au thermocompression bonding forms a bond through atomic diffusion, and requires a relatively high temperature and bonding force as the melting temperature for gold is 1064° C. Cracking of entire VCSEL devices was caused by Au—Au compression bonding due to the high temperature and force required for Au—Au thermocompression bonding. However, Au—Au thermocompression bonding does not include a molten liquid phase during bonding because it is conducted below the melting temperature of Au and gold has a very high melting temperature.

A technique that incorporates a liquid metal phase during bonding, such as SLID bonding, enables flip-chip bonding at significantly lower bonding forces to help overcome several problems caused by Au—Au thermocompression bonding.

The relatively soft bonding metal used for SLID can reduce cracking by providing cushioning as the bonding surfaces are pressed together.

Utilizing a liquid metal phase during bonding to completely embed the p-DBR within metal, thereby creating a thicker metal pathway for heat transport. Unlike Au—Au thermocompression bonding, utilizing a liquid metal phase (as possible with Au—In SLID bonding) during bonding allows the bottom thermally insulating DBR (p-DBR) to be completely embedded within bonding metal. Embedding the thermally-insulating p-DBR within metal creates a much thicker metal pathway for heat transport, especially compared to an m-plane VCSELs in which heat flow was bottlenecked through a cracked 1 μm-thick gold contact along the sidewall of the bottom DBR (as fabricated using Au—Au thermocompression bonding).

FIG. 12 illustrates a VCSEL bonded to a flip chip substrate using SLLID, illustrating the SLID softens the bond to reduce cracking and enables a thicker metal pathway for heat transport.

Figure 13:
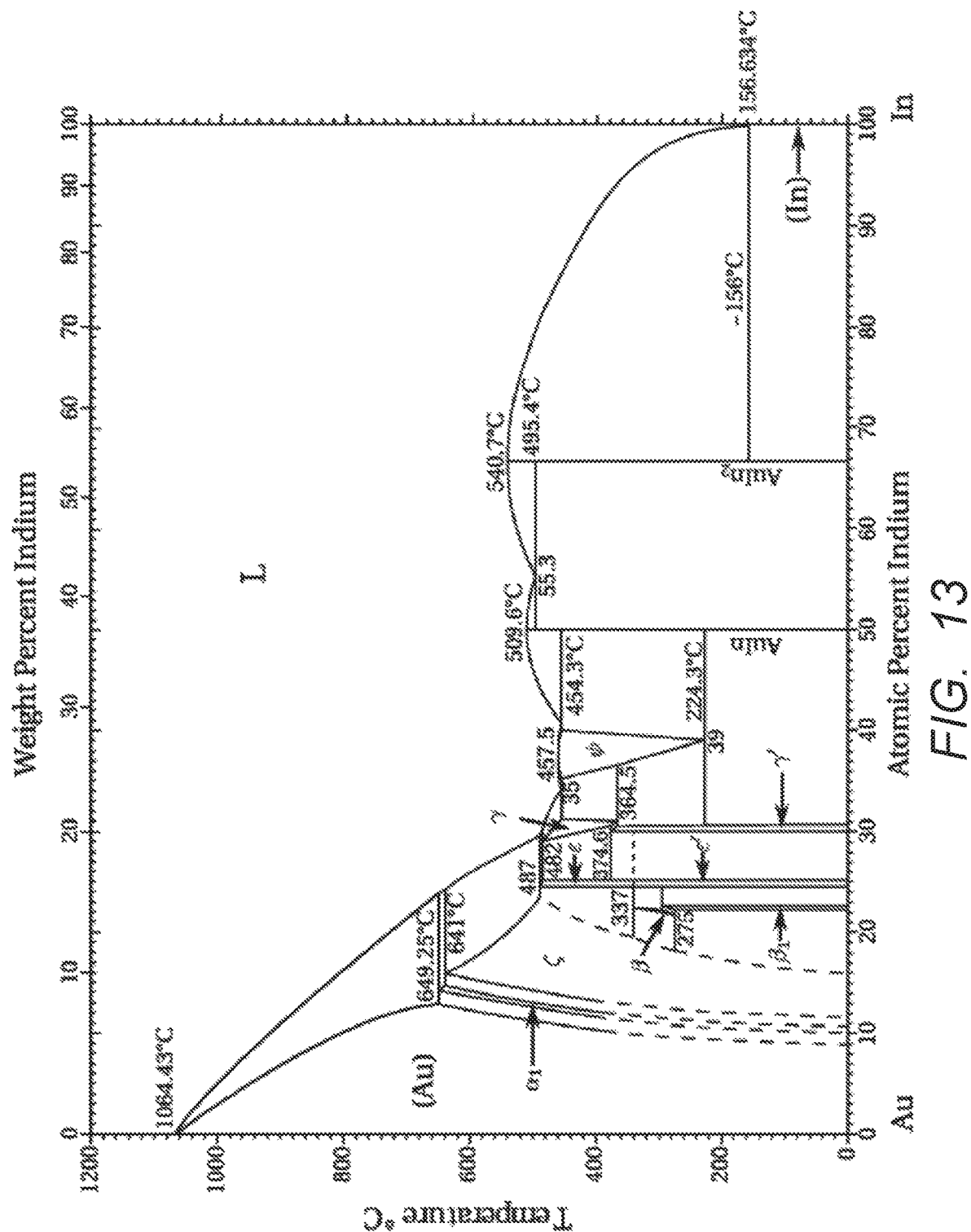

FIG. 13 (Au—In phase diagram) illustrates the benefits of using Au—In SLID bonding because Au—In alloys have a unique low-temperature liquid phase above ~156° C. for In-rich alloys (above 54 wt. % In). This enables flip-chip bonding at much lower temperatures and forces compared to Au—Au or Au—Sn bonding while also incorporating a liquid metal phase. As seen in the phase diagram, Au—In alloys with In compositions above 54% consist of a mixture of an In phase and $AuIn_2$ intermetallic compound (53.8 wt. % In) with a solidus temperature of 156° C. Above 156° C., the mixture forms a liquid phase with $AuIn_2$ grains. The alloy becomes a mixture of AuIn (36.79 wt. % In) and $AuIn_2$ intermetallic compounds for compositions between 36.8-54 wt. % In, and the solidus temperature becomes much higher with a value of 495.4° C. This considerable difference in solidus temperatures is a particularly useful feature because it enables a relatively low-temperature liquid phase above 156° C. during bonding (for >54 wt. % In alloys) while the final alloy can be designed to have a lower In composition so it can withstand temperatures up to 495.4° C. without melting (for 36.8-54 wt. % In alloys).

Although other types of bonding could also work, such as Au—Sn, Au—Ge, and Au—Si eutectic alloys, Au—In alloys have the lowest temperature liquid phase. Pure indium bonding could also be employed, but the resulting bond is only stable up to ~156 degrees Celsius (melting temperature of indium). Au—In SLID bonding can be conducted so the Au—In alloy after bonding has a lower In composition so the bond is stable up to ~495 degrees Celsius.

Gold-tin (Au—Sn) alloys are another possible alternative as they have a fairly low melting temperature of 280° C. at the eutectic composition of 80% Au and 20% Sn. However. 280° C. is not much lower than the temperature used in the previous Au—Au bonding experiments, so cracking could remain a problem.

H. Advantages and Improvements

Nonpolar III-nitride VCSELs are very promising due to their unique properties, such as higher material gain and 100% polarization ratio. Thicker QWs are desirable for III-nitride VCSELs to maximize gain enhancement factor. Compared to c-plane, nonpolar and semipolar orientations enable thicker quantum wells, >9 nm thick.

This disclosure details the fabrication process for the first m-plane VCSEL that achieved lasing under CW operation at room temperature. All previous m-plane III-nitride VCSELs were only able to lase under pulsed operation. Compared to the previous m-plane VCSEL design [10], the key performance improvements of the present invention are summarized in Table 1.

TABLE 1

Key performance improvements of the present invention

| | Previous m-plane VCSEL [10] | The present invention |
|---|---|---|
| CW Operation | No | Yes |
| Peak Output Power | 0.55 mW | 1 mW |
| Differential Efficiency $\eta_d$ | 0.26% | 0.78% |
| Series Resistance $R_d$ | 37 Ω | 27.4 Ω |
| Lateral Mode Profile | Filamentary Lasing | Well-defined lateral mode |

Further information on embodiments of the present invention can be found in [27-30].

Nomenclature

GaN and its ternary and quaternary compounds incorporating aluminum and indium (AlGaN, InGaN, AlInGaN) are commonly referred to using the terms (Al,Ga,In)N, III-nitride, III-N, Group III-nitride, nitride, $Al_{(1-x-y)}In_yGa_xN$ where $0<x<1$ and $0<y<1$, or AlInGaN, as used herein. All these terms are intended to be equivalent and broadly construed to include respective nitrides of the single species, Al, Ga, and In, as well as binary, ternary and quaternary compositions of such Group III metal species. Accordingly, these terms comprehend the compounds AlN, GaN, and InN, as well as the ternary compounds AlGaN, GaInN, and AlInN, and the quaternary compound AlGaInN, as species included in such nomenclature. When two or more of the (Ga, Al, In) component species are present, all possible compositions, including stoichiometric proportions as well as "off-stoichiometric" proportions (with respect to the relative mole fractions present of each of the (Ga, Al, In) component species that are present in the composition), can be employed within the broad scope of the invention. Accordingly, it will be appreciated that the discussion of the invention hereinafter in primary reference to GaN materials is applicable to the formation of various other (Al, Ga, In)N material species. Further, (Al,Ga,In)N materials within the scope of the invention may further include minor quantities of dopants and/or other impurity or inclusional materials. Boron (B) may also be included.

One approach to eliminating the spontaneous and piezo-electric polarization effects in GaN or III-nitride based optoelectronic devices is to grow the III-nitride devices on nonpolar planes of the crystal. Such planes contain equal numbers of Ga (or group III atoms) and N atoms and are charge-neutral. Furthermore, subsequent nonpolar layers are equivalent to one another so the bulk crystal will not be polarized along the growth direction. Two such families of symmetry-equivalent nonpolar planes in GaN are the {11-20} family, known collectively as a-planes, and the {1-100} family, known collectively as m-planes. Thus, nonpolar III-nitride is grown along a direction perpendicular to the (0001) c-axis of the III-nitride crystal.

Another approach to reducing polarization effects in (Ga, Al,In,B)N devices is to grow the devices on semi-polar planes of the crystal. The term "semi-polar plane" (also referred to as "semipolar plane") can be used to refer to any plane that cannot be classified as c-plane, a-plane, or m-plane. In crystallographic terms, a semi-polar plane may include any plane that has at least two nonzero h, i, or k Miller indices and a nonzero l Miller index.

Some commonly observed examples of semi-polar planes include the (11-22), (10-11), and (10-13) planes. Other examples of semi-polar planes in the wurtzite crystal structure include, but are not limited to, (10-12), (20-21), and (10-14). The nitride crystal's polarization vector lies neither within such planes or normal to such planes, but rather lies at some angle inclined relative to the plane's surface normal. For example, the (10-11) and (10-13) planes are at 62.98° and 32.06° to the c-plane, respectively.

The Gallium or Ga face of GaN is the $c^+$ or (0001) plane, and the Nitrogen or N-face of GaN or a III-nitride layer is the $c^-$ or (000-1) plane.

The prefix n- (e.g., n-GaN) represents n-type, the prefix $n^{++}$-(e.g., $n^{++}$-GaN) represents higher n-type dopant concentration, the prefix p- (e.g., p-GaN) represents p-type, the prefix $p^{++}$-(e.g., p++-GaN) represents higher p-type dopant concentration.

REFERENCES

The following references are incorporated by reference herein.

[1] R. Michalzik and Rainer., *VCSELs fundamentals, technology and applications of vertical-cavity surface-emitting lasers*. Springer, 2013.

[2] T. Onishi, O. Imafuji, K. Nagamatsu, M. Kawaguchi, K. Yamanaka, and S. Takigawa, "Continuous Wave Operation of GaN Vertical Cavity Surface Emitting Lasers at Room Temperature," *Quantum Electron. IEEE J.*, vol. 48, no. 9, pp. 1107-1112, 2012.

[3] G. Cosendey, A. Castiglia, G. Rossbach, J-F. Carlin, and N. Grandjean, "Blue monolithic AlInN-based vertical cavity surface emitting laser diode on free-standing GaN substrate," *Appl. Phys. Lett.*, vol. 101, no. 15, p. 151113, 2012.

[4] C. Holder, J. S. Speck, S. P. DenBaars, S. Nakamura, and D. Feezell, "Demonstration of Nonpolar GaN-Based Vertical-Cavity Surface-Emitting Lasers," *Appl. Phys. Express*, vol. 5, no. 9, p. 92104, September 2012.

[5] D. Kasahara, D. Morita, T. Kosugi, K. Nakagawa, J. Kawamata, Y. Higuchi, H. Matsumura, and T. Mukai, "Demonstration of blue and green GaN-based vertical-cavity surface-emitting lasers by current injection at room temperature," *Appl. Phys. Express*, vol. 4, no. 7, 2011.

[6] T. C. Lu, S. W. Chen, T. T. Wu, P. M. Tu, C. K. Chen, C. H. Chen, Z. Y. Li, H. C. Kuo, and S. C. Wang, "Continuous wave operation of current injected GaN vertical cavity surface emitting lasers at room temperature," *Appl. Phys. Lett.*, vol. 97, no. 7, pp. 1-4, 2010.

[7] K. Omae, Y. Higuchi, K. Nakagawa, H. Matsumura, and T. Mukai, "Improvement in lasing characteristics of GaN-based vertical-cavity surface-emitting lasers fabricated using a GaN substrate," *Appl. Phys. Express*, vol. 2, no. 5, pp. 5-8, 2009.

[8] Y. Higuchi, K. Omae, H. Matsumura, and T. Mukai, "Room-temperature CW lasing of a GaN-based vertical-cavity surface-emitting laser by current injection," *Appl. Phys. Express*, vol. 1, no. 12, pp. 1211021-1211023, 2008.

[9] T. C. Lu, T. T. Kao, S. W. Chen, C. C. Kao, H. C. Kuo, and S. C. Wang, "CW lasing of current injection blue GaN-based vertical cavity surface emitting lasers," 2008 *Conf. Quantum Electron. Laser Sci. Conf Lasers Electro-Optics, CLEO/QELS*, vol. 141102, no. 2008, 2008.

[10] J. T. Leonard, E. C. Young, B. P. Yonkee, D. A. Cohen, T. Margalith, S. P. DenBaars, J. S. Speck, and S. Nakamura. "Demonstration of a III-nitride vertical-cavity surface-emitting laser with a III-nitride tunnel junction intracavity contact," *Appl. Phys. Lett.*, vol. 107, no. 9, 2015.

[11] D. H. Hsieh, A. J. Tzou, D. W. Lin, T. S. Kao, C. C. Lin, C. Y. Chang, and H. C. Kuo, "Greatly improved carrier injection in GaN-based VCSEL by multiple quantum barrier electron blocking layer," *Proc. Int. Conf. Numer. Simul. Optoelectron. Devices, NUSOD*, vol. 2015-May, no. 21, pp. 139-140, 2015.

[12] J. T. Leonard, D. A. Cohen, B. P. Yonkee, R. M. Farrell, T. Margalith, S. Lee, S. P. Denbaars, J. S. Speck, and S. Nakamura, "Nonpolar III-nitride vertical-cavity surface-emitting lasers incorporating an ion implanted aperture," *Appl. Phys. Lett.*, vol. 107, no. 1, 2015.

[13] S. Izumi, N. Fuutagawa, T. Hamaguchi, M. Murayama, M. Kuramoto, and H. Narui, "Room-temperature continuous-wave operation of GaN-based vertical-cavity surface-emitting lasers fabricated using epitaxial lateral overgrowth," *Appl. Phys. Express*, vol. 8, no. 6, pp. 6-9, 2015.

[14] M. Kawaguchi, O. Imafuji, K. Nagamatsu, K. Yamanaka, S. Takigawa, and T. Katayama, "Design and Lasing Characteristics of GaN Vertical Elongated Cavity Surface Emitting Lasers," *Proc. SPIE*, vol. 8986, pp. 1-6, 2014.

[15] C. O. Holder, J. T. Leonard, R. M. Farrell, D. A. Cohen, B. Yonkee, J. S. Speck, S. P. Denbaars, S. Nakamura, and D. F. Feezell, "Nonpolar III-nitride vertical-cavity surface emitting lasers with a polarization ratio of 100% fabricated using photoelectrochemical etching," *Appl. Phys. Lett.*, vol. 105, no. 3, pp. 1-6, 2014.

[16] W. J. Liu, X. L. Hu, L. Y. Ying, J. Y. Zhang, and B. P. Zhang, "Room temperature continuous wave lasing of electrically injected GaN-based vertical cavity surface emitting lasers," *Appl. Phys. Lett.*, vol. 104, no. 25, pp. 1-5, 2014.

[17] R. B. Xu, Y. Mei, B. P. Zhang, L. Y. Ying, Z. W. Zheng, W. Hofmann, J. P. Liu, H. Yang, M. Li, and J. Zhang, "Simultaneous blue and green lasing of GaN-based vertical-cavity surface-emitting lasers," *Semicond. Sci. Technol.*, vol. 32, no. 10, p. 105012, October 2017.

[18] K. Ikeyama, Y. Kozuka, K. Matsui, S. Yoshida, T. Akagi, Y. Akatsuka, N. Koide, T. Takeuchi, S. Kamiyatna, M. Iwaya, and I. Akasaki, "Room-temperature continuous-wave operation of GaN-based vertical-cavity surface-emitting lasers with n-type conducting AlInN/GaN distributed Bragg reflectors," *Appl. Phys. Express*, vol. 9, no. 10, p. 102101, October 2016.

[19] G. Weng, Y. Mei, J. Liu, W. Hofmann, L. Ying, J. Zhang, Y. Bu, Z. Li, H. Yang, and B. Zhang, "Low threshold continuous-wave lasing of yellow-green InGaN-QD vertical-cavity surface-emitting lasers," *Opt. Express*, vol. 24, no. 14, p. 15546, July 2016.

[20] T. Furuta, K. Matsui, Y. Kozuka, S. Yoshida, N. Hayasi, T. Akagi, N. Koide, T. Takeuchi, S. Kamiyama, M. Iwaya, and I. Akasaki, "1.7-mW nitride-based vertical-cavity surface-emitting lasers using AlInN/GaN bottom DBRs," 2016 *International Semiconductor Laser Conference (ISLC)*. pp, 1-2. 2016.

[21] K. Matsui, Y. Kozuka, K. Ikeyama, K. Horikawa, T. Furuta, T. Akagi, T. Takeuchi, S. Kamiyama, M. Iwaya, and I. Akasaki, "GaN-based vertical cavity surface emitting lasers with periodic gain structures," *Jpn. J. Appl. Phys.*, vol. 55, no. 5S, p. 05FJ08, May 2016.

[22] P. S. Yeh, C.-C. Chang, Y.-T. Chen. D.-W. Lin, J.-S. Liou, C. C. Wu, J. H. He, and H.-C. Kuo, "GaN-based vertical-cavity surface emitting lasers with sub-milliamp threshold and small divergence angle," *Appl. Phys. Lett.*, vol. 109, no. 24, p. 241103, December 2016.

[23] T. Furuta, K. Matsui, K. Horikawa, K. Ikeyatna, Y. Kozuka, S. Yoshida, T. Akagi, T. Takeuchi, S. Kamiyama, M. Iwaya, and I. Akasaki, "Room-temperature CW operation of a nitride-based vertical-cavity surface-emitting laser using thick GaInN quantum wells Room-temperature CW operation of a nitride-based vertical-cavity surface-emitting laser using thick GaInN quantum wells," *Jpn. J. Appl. Phys.*, vol. 55, p. 05FJ11, 2016.

[24] J. T. Leonard, B. P. Yonkee, D. A. Cohen, L. Megalini, S. Lee, J. S. Speck, S. P. Denbaars, and S. Nakamura, "Nonpolar III-nitride vertical-cavity surface-emitting laser with a photoelectrochemically etched air-gap aperture," *Appl. Phys. Lett.*, vol. 108, no. 3, 2016.

[25] T. Hamaguchi, H. Nakajima, M. Ito, J. Mitomo, S. Satou, N. Fuutagawa, and H. Narui, "Lateral carrier confinement of GaN-based vertical-cavity surface-emitting diodes using boron ion implantation," *Jpn. J. Appl. Phys.*, vol. 55, no. 12, p. 122101, 2016.

[26] T. Hamaguchi, N. Fuutagawa, S. Izumi, M. Murayama, and H. Narui, "Milliwatt-class GaN-based blue vertical-cavity surface-emitting lasers fabricated by epitaxial lateral overgrowth," *Phys. Status Solidi Appl. Mater, Sci.,* vol. 213, no. 5, pp. 1170-1176, 2016.

[27] Continuous-wave operation of m-plane GaN-based vertical-cavity surface-emitting lasers with a tunnel junction intracavity contact by C. Forman et. al., *Appl. Phys. Lett.* 112, 111106 (2018); https://doi.org/10.1063/1.5007746

[28] Continuous-wave operation of nonpolar GaN-based vertical-cavity surface-emitting lasers, by C. Forman et. al, *Proceedings Volume* 10532, *Gallium Nitride Materials and Devices XIII;* 105321C (2018), https://doi.org/10.1117/12.2314885,

[29] The world's first CW non-polar GaN VCSEL, by C. Forman et. al., WWW.COMPOUNDSEMICONDUCTOR. NET 1 MARCH 2018 https://data.angel.digital/pdf/Compound_Semiconductor_Issue_2_2018.pdf#page=48

[30] The World's First CW Non-polar GaN VCSEL, The World's First CW Non-polar GaN VCSEL, by C. Forman et. al., Vol. 24 Issue 2, March 2018, article found at website "https://compoundsemiconductor.net/article/104228/The_World's_First_CW_Non-polar_GaN_VCSEL/feature."

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A device, comprising:
    a mount;
    a Vertical Cavity Surface Emitting Laser (VCSEL) on the mount; and
    a thermally conductive bond between the mount and the VCSEL, the thermally conductive bond comprising a layer of metal having a thermal conductivity such that heat, generated during operation of the VCSEL, is transferred from the VCSEL to the mount and the VCSEL emits continuous wave electromagnetic radiation.

2. The device of claim 1, wherein the thermally conductive bond comprises no cracks or fewer cracks than a bond between the VCSEL and the mount formed using Au—Au thermal compression bonding.

3. The device of claim 1, wherein the thermally conductive bond is formed using solid-liquid interdiffusion bonding.

4. The device of claim 1, wherein:
    the VCSEL comprises a first mirror and a second mirror defining a cavity for the continuous wave electromagnetic radiation, and
    the VCSEL is bonded to the mount by forming the thermally conductive bond comprising the metal, in a liquid state, around the first mirror.

5. The device of claim 1, wherein:
    the VCSEL comprises a first mirror and a second mirror defining a cavity for the continuous wave electromagnetic radiation,
    the thermally conductive bond comprises a metal layer comprising the metal, and
    one of the first mirror or the second mirror is embedded in the metal layer.

6. The device of claim 1, wherein:
    the VCSEL comprises a first mirror and a second mirror defining a cavity for the continuous wave electromagnetic radiation, and
    the thermally conductive bond comprises a metal layer cast around the first mirror or the second mirror acting as a mold for the metal layer.

7. The device of claim 1, wherein the thermally conductive bond comprises an intermetallic compound comprising ther metal and having a solid phase containing two or more metallic elements.

8. The device of claim 1, wherein the thermally conductive bond comprises the metal comprising a first metal diffused into a second metal so as to intermix with the second metal, the first metal having a lower melting point than the second metal.

9. The device of claim 8, wherein the first metal comprises indium and the second metal comprises gold.

10. The device of claim 1, wherein:
    the VCSEL includes a light emitting III-nitride active region emitting the continuous wave electromagnetic radiation in response to current inputted into the light emitting III-nitride active region,
    the light emitting III-nitride active region includes quantum wells (QWs), and
    each of the quantum wells have a thickness of more than 8 nm.

11. The device of claim 10, wherein the thickness is in a range of 8-20 nanometer (nm).

12. The device of claim 10, wherein the VCSEL has a nonpolar or semipolar crystal orientation.

13. The device of claim 1, wherein:
    the VCSEL has a cavity length of at least 7 λ, where λ is a peak wavelength of the continuous wave electromagnetic emitted from the VCSEL's active region, as measured in the active region, and
    the peak wavelength is a wavelength of the continuous wave electromagnetic radiation having a highest intensity.

14. The device of claim 13, wherein the cavity length is in a range of 20 λ-100 λ.

15. The device of claim 1, wherein the VCSEL further includes:
    An active region between a first III-nitride n-type layer and a III-nitride p-type layer,
    a second III-nitride n-type layer forming a tunnel junction with the III-nitride p-type layer,
    a contact layer for the tunnel junction, and
    a top surface of the contact layer having a root mean square surface roughness (RMS) of less than 2 nanometers (nm) when the VCSEL is a nonpolar device or less than 1 nm when the VCSEL is a semipolar device.

16. The device of claim 1, further comprising:
    an active region between a III-nitride n-type layer and a III-nitride p-type layer, wherein
    an n-side surface of the III-nitride n-type layer is exposed after etching to at least partially remove a substrate on which the active region was grown, and
    the n-side surface is surface treated so as to remove an oxide residue after etching and has an RMS surface roughness less than 1 nm over a 5 μm×5 μm, a 1 μm×1 μm, or 10 μm×10 μm area.

17. A method of fabricating a Vertical Cavity Surface Emitting Laser (VCSEL) comprising:
    obtaining a VCSEK comprising a first mirror and a second mirror defining a cavity for electromagnetic radiation emitted from the VCSEL;

bonding the VCSEL to a mount using metal, wherein the bonding comprises:

providing a metal layer on the mount, the metal layer comprising a first metal and a second metal, and heating the metal layer so that the first metal is in liquid metal state, positioning the VCSEL on the metal layer including the first metal in the liquid metal state, including positioning the first mirror on the metal layer using a force or pressure when the first metal is in the liquid metal state, so that the first mirror is embedded in the metal layer after the metal layer has solidified, and allowing the metal layer to solidify and form a bond between the VCSEL and the mount.

18. The method of claims 4, wherein the VCSEL is bonded to the mount by solid-liquid interdiffusion bonding, the first metal comprises indium, and the second metal comprises gold.

19. The device of claim 1, wherein the VCSEL comprises a cavity including a GaN layer and a distributed bragg reflector (DBR) mirror on the GaN layer; and the thermally conductive bond is provided from a surface of the DBR mirror to a surface of the GaN layer.

20. The device of claim 19, wherein the thermally conductive bond comprises a layer of the metal comprising a first metal comprising indium diffused into a second metal comprising.

21. A device, comprising:

a mount;

a nonpolar or semipolar Vertical Cavity Surface Emitting Laser (VCSEL) on the mount; and a thermally conductive bond between the mount and the VCSEL, the thermally conductive bond comprising a layer of metal having a thermal conductivity such that heat, generated during operation of the VCSEL, is transferred from the VCSEL to the mount and the VCSEL emits continuous wave electromagnetic radiation.

* * * * *